United States Patent
Ciccarelli et al.

(10) Patent No.: US 6,175,279 B1
(45) Date of Patent: Jan. 16, 2001

(54) AMPLIFIER WITH ADJUSTABLE BIAS CURRENT

(75) Inventors: Steven C. Ciccarelli, Encinitas; Ralph E. Kaufman, La Mesa; Paul E. Peterzell, San Diego, all of CA (US)

(73) Assignee: Qualcomm Incorporated, San Diego, CA (US)

( * ) Notice: Under 35 U.S.C. 154(b), the term of this patent shall be extended for 0 days.

(21) Appl. No.: 09/034,979

(22) Filed: Mar. 4, 1998

Related U.S. Application Data

(63) Continuation-in-part of application No. 08/987,305, filed on Dec. 9, 1997.

(51) Int. Cl.$^7$ ...................................................... H03F 3/04
(52) U.S. Cl. .......................................... 330/296; 330/285
(58) Field of Search ..................................... 330/277, 285, 330/283; 4/296

(56) References Cited

U.S. PATENT DOCUMENTS

| | | | |
|---|---|---|---|
| 3,436,672 | * 4/1969 | Delagrange | 330/277 |
| 4,077,012 | 2/1978 | Iwamatsu | 330/253 |
| 4,136,292 | * 1/1979 | Suzuki et al. | 330/253 |
| 4,356,453 | 10/1982 | Sueyoshi | 330/277 |
| 4,520,324 | * 5/1985 | Jett, Jr. et al. | 330/277 |
| 4,542,350 | * 9/1985 | Akazawa et al. | 330/283 |
| 5,283,479 | * 2/1994 | Rosseel et al. | 307/446 |
| 5,666,089 | 9/1997 | Ehlers | 333/81 |
| 5,710,522 | * 1/1998 | Pass | 330/296 |
| 5,734,272 | * 3/1998 | Belot et al. | 327/544 |

FOREIGN PATENT DOCUMENTS

| | | | |
|---|---|---|---|
| 0789450 | 1/1997 | (EP) | H03F/1/02 |
| 9733378 | 9/1997 | (WO) | H04B/1/16 |

* cited by examiner

Primary Examiner—Robert Pascal
Assistant Examiner—Khanh Van Nguyen
(74) Attorney, Agent, or Firm—Phillip Wadsworth; Charles D. Brown; Christopher Edwards

(57) ABSTRACT

An amplifier having an adjustable current source which can be controlled to provide the requisite level of performance at reduced current consumption. The amplifier is first designed using one of many designs available and known in the art. A current source is then designed to provide adjustable bias current for the amplifier. The current source can be designed with MOSFETs which require no additional bias current and can accept a standard digital control signal. The current source can also be designed with active devices which are selected based on the logic of the control signals for ease of interface. The bias current determines the linearity and noise performance of the amplifier. The bias current is adjusted to provide the requisite level of performance while reducing power consumption. The current source can be designed to operate in discrete steps or to have substantially continuous current steps.

8 Claims, 13 Drawing Sheets

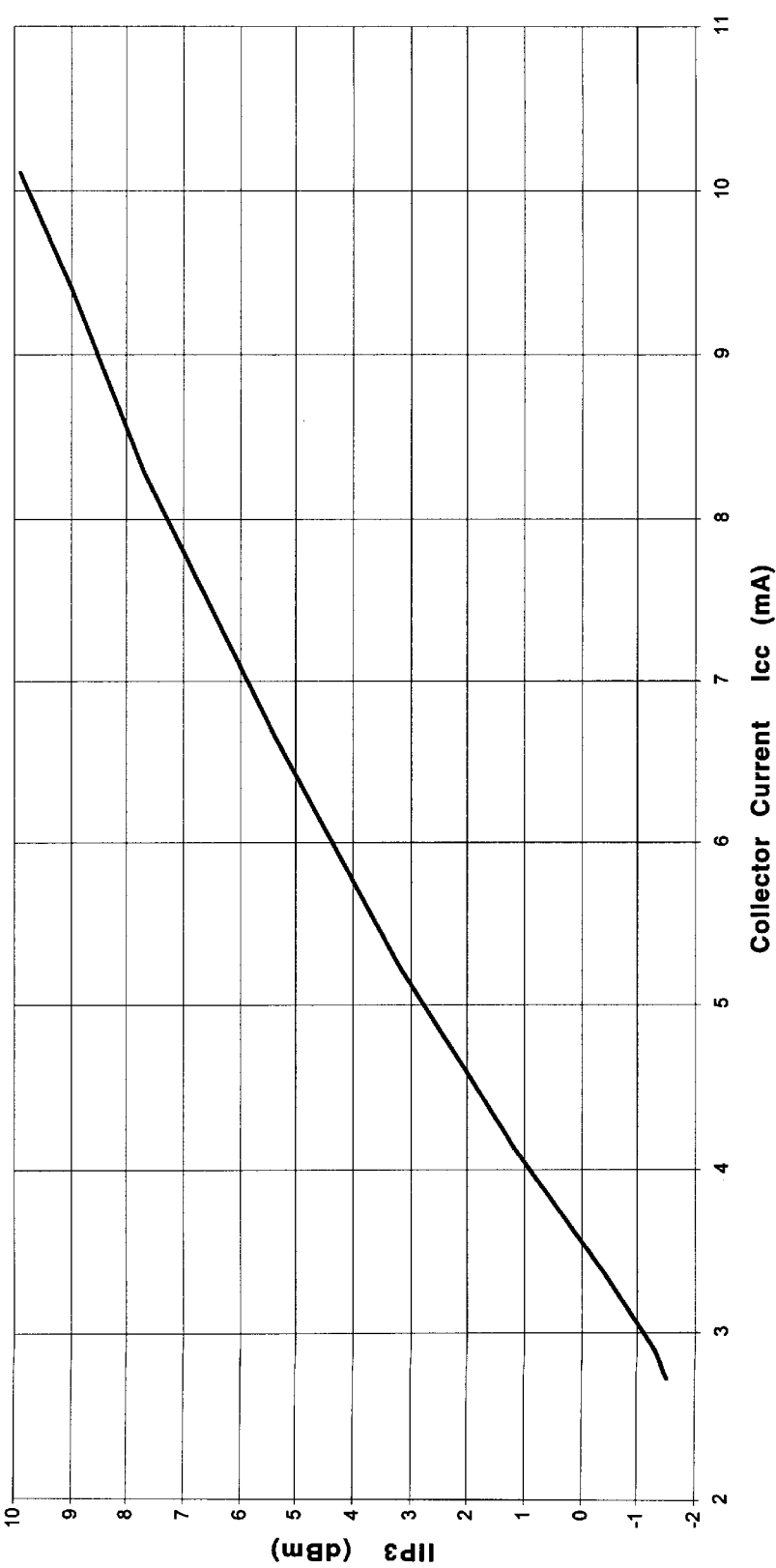
FIG. 6A - IIP3 of LNA vs. Collector Bias Current Icc

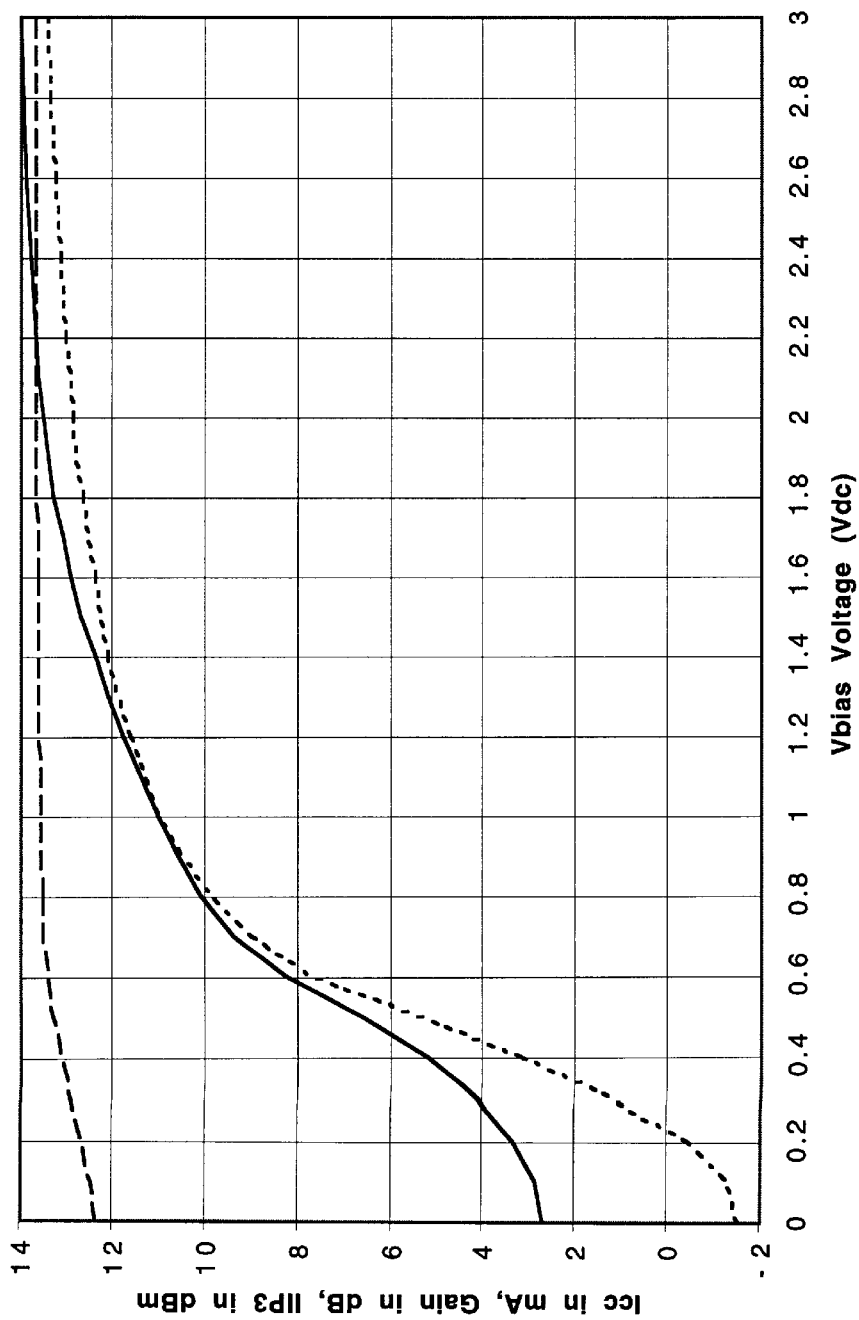

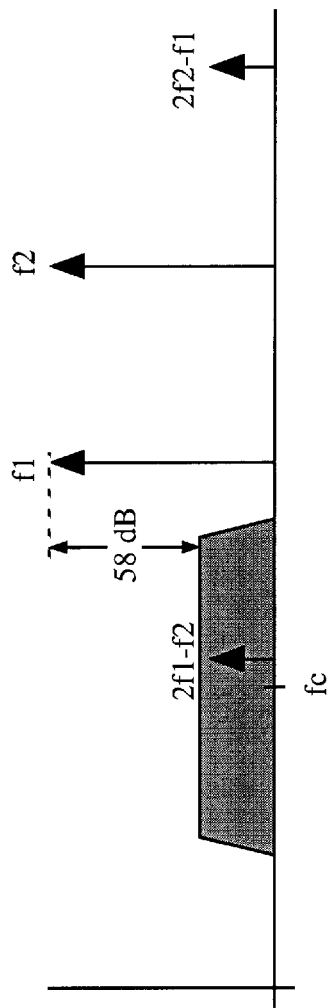
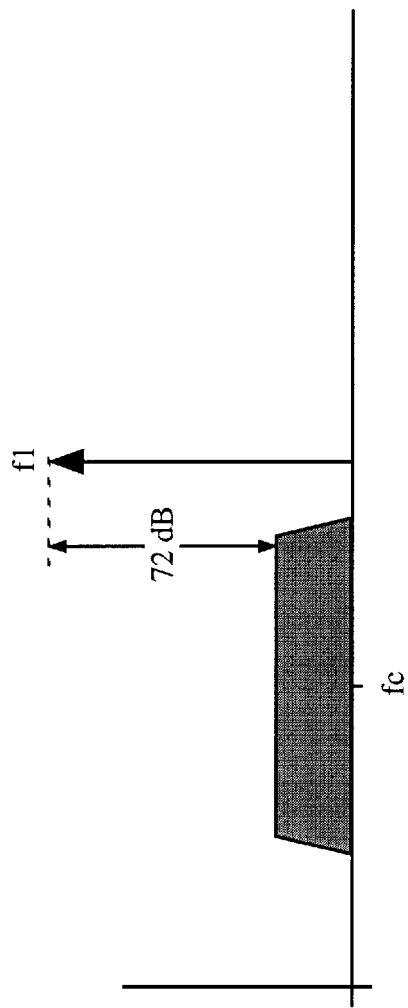
FIG. 7A
FIG. 7B

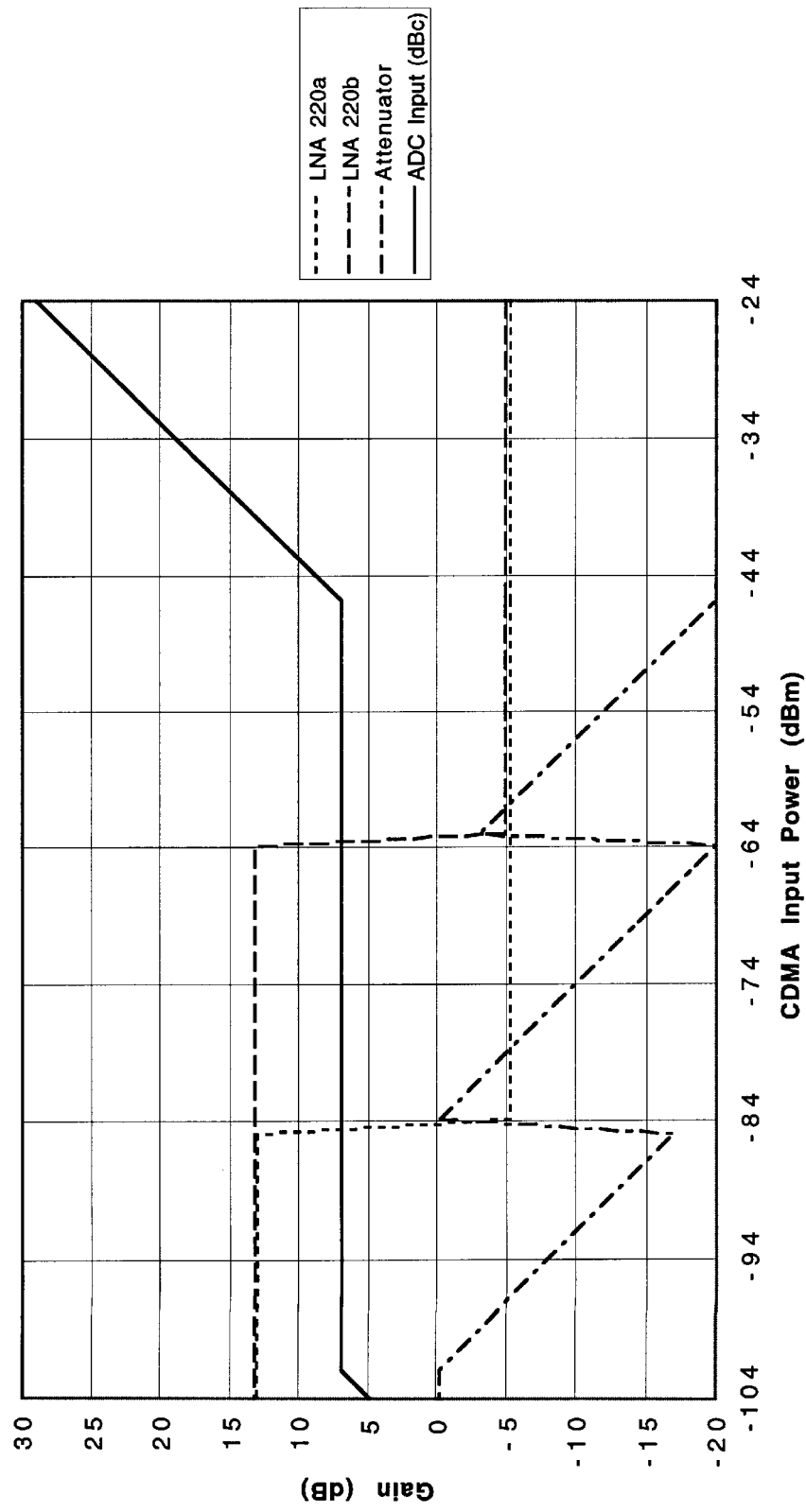

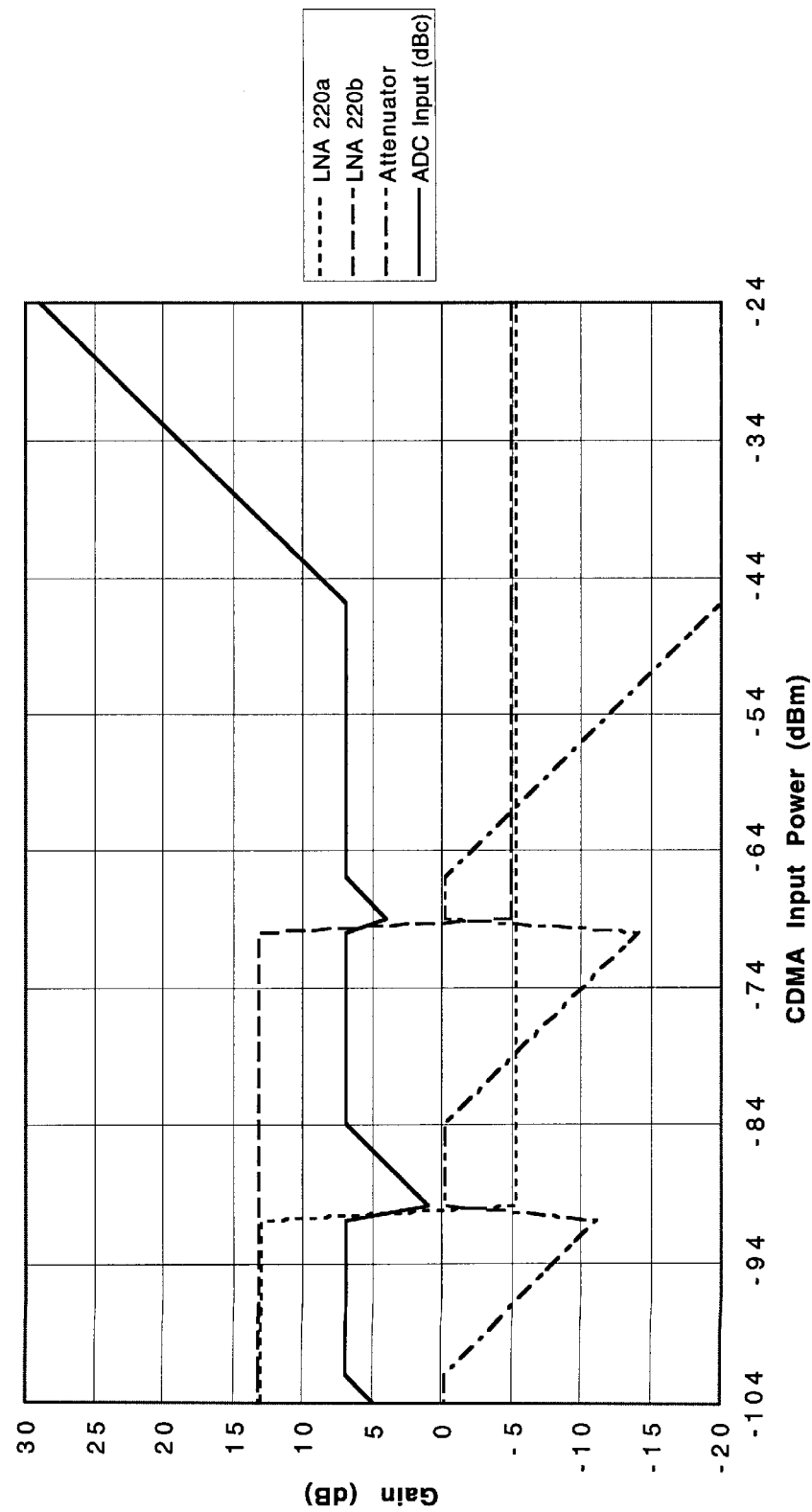

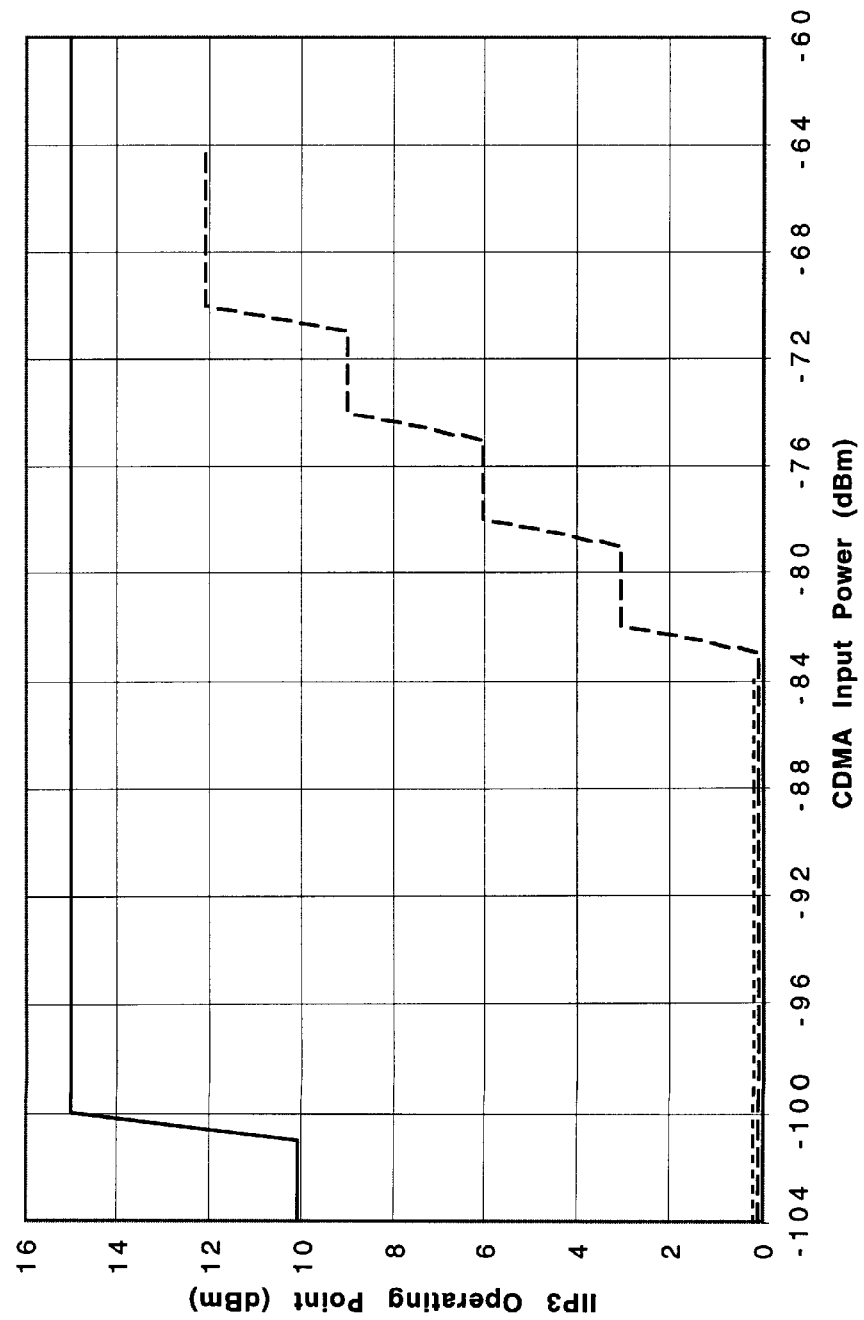

AMPLIFIER WITH ADJUSTABLE BIAS CURRENT

This application is a continuation in part of application Ser. No. 08/987,305 entitled "PROGRAMMABLE LINEAR RECEIVER", filed Dec. 9, 1997 and assigned to the assignee of the present invention.

BACKGROUND OF THE INVENTION

I. Field of the Invention

The present invention relates to communications. More particularly, the present invention relates to a novel and improved amplifier with adjustable bias current.

II. Description of the Related Art

The design of a high performance receiver is made challenging by various design constraints. First, high performance is required for many applications. High performance can be described by the linearity of the active devices (e.g. amplifiers, mixers, etc.) and the noise figure of the receiver. Second, for some applications such as in a cellular communication system, power consumption is an important consideration because of the portable nature of the receiver. Generally, high performance and high efficiency are conflicting design considerations.

An active device has the following transfer function:

$$y(x)=a_1 \cdot x + a_2 \cdot x^2 + a_3 \cdot x^3 + \text{higher order terms}, \quad (1)$$

where x is the input signal, y(x) is the output signal, and $a_1$, $a_2$, and $a_3$ are coefficients which define the linearity of the active device. For simplicity, higher order terms (e.g. terms above third order) are ignored. For an ideal active device, the coefficients $a_2$ and $a_3$ are 0.0 and the output signal is simply the input signal scaled by $a_1$. However, all active devices experience some amount of non-linearity which is quantified by the coefficients $a_2$ and $a_3$. Coefficient $a_2$ defines the amount of second order non-linearity and coefficient $a_3$ defines the amount of third order non-linearity.

Most communication systems are narrow band systems which operate on an input RF signal having a predetermined bandwidth and center frequency. The input RF signal typically comprises other spurious signals located throughout the frequency spectrum. Non-linearity within the active devices causes intermodulation of spurious signals, resulting in products which may fall into the signal band.

The effect of second order non-linearity (e.g. those caused by the $x^2$ term) can usually be reduced or eliminated by careful design methodology. Second order non-linearity produces products at the sum and difference frequencies. Typically, the spurious signals which can produce in-band second-order products are located far away from the signal band and can be easily filtered. However, third order non-linearity are more problematic. For third order non-linearity, spurious signals $x=g_1 \cdot \cos(w_1 t) + g_2 \cdot \cos(w_2 t)$ produce products at the frequencies $(2w_1-w_2)$ and $(2w_2-w_1)$. Thus, near band spurious signals (which are difficult to filter) can produce third order intermodulation products falling in-band, causing degradation in the received signal. To compound the problem, the amplitude of the third-order products are scaled by $g_1 \cdot g_2^2$ and $g_1^2 \cdot g_2$. Thus, every doubling of the amplitude of the spurious signals produces an eight-fold increase in the amplitude of the third order products. Viewed another way, every 1 dB increase in the input RF signal results in 1 dB increase in the output RF signal but 3 dB increase in the third order products.

The linearity of a receiver (or the active device) can be characterized by the input-referred third-order intercept point (IIP3). Typically, the output RF signal and the third-order intermodulation products are plotted versus the input RF signal. As the input RF signal is increased, the IIP3 is a theoretical point where the desired output RF signal and the third-order products become equal in amplitude. The IIP3 is an extrapolated value since the active device goes into compression before the IIP3 point is reached.

For a receiver comprising multiple active devices connected in cascade, the IIP3 of the receiver from the first stage of active device to the $n^{th}$ stage can be calculated as follows:

$$IIP3_n = -10 \cdot \log_{10}[10^{-IIP3_{n-1}/10} + 10^{(Av_n - IIP3_{dn})/10}], \quad (2)$$

where $IIP3_n$ is the input-referred third-order intercept point from the first stage of active device to the $n^{th}$ stage, $IIP3_{n-1}$ is the input-referred third-order intercept point from the first stage to the $(n-1)^{th}$ stage, $Av_n$ is the gain of the $n^{th}$ stage, $IIP3_{dn}$ is the input-referred third-order intercept point of the $n^{th}$ stage, and all terms are given in decibel (dB). The calculation in equation (2) can be carried out in sequential order for subsequent stages within the receiver.

From equation (2), it can be observed that one way to improve the cascaded IIP3 of the receiver is to lower the gain before the first non-linear active device. However, each active device also generates thermal noise which degrades the signal quality. Since the noise level is maintained at a constant level, the degradation increases as the gain is lowered and the signal amplitude is decreased. The amount of degradation can be measured by the noise figure (NF) of the active device which is given as follows:

$$NF_d = SNR_{in} - SNR_{out}, \quad (3)$$

where $NF_d$ is the noise figure of the active device, $SNR_{in}$ is the signal-to-noise ratio of the input RF signal into the active device, $SNR_{out}$ is signal-to-noise ratio of the output RF signal from the active device, and $NF_d$, $SNR_{in}$ and $SNR_{out}$ are all given in decibel (dB). For a receiver comprising multiple active devices connected in cascade, the noise figure of the receiver from the first stage of active device to the $n^{th}$ stage can be calculated as follows:

$$NF_n = 10 \cdot \log_{10}\left[10^{(NF_{n-1}/10)} + \frac{10^{(NF_{dn}/10)} - 1}{10^{(G_{n-1}/10)}}\right], \quad (4)$$

where $NF_n$ is the noise figure from the first stage to the $n^{th}$ stage, $NF_{n-1}$ is the noise figure of the first stage to the $(n-1)$ stage, $NF_{dn}$ is the noise figure of the $n^{th}$ stage, and $G_{n-1}$ is the accumulated gain of the first stage through the $(n-1)^{th}$ stage in dB. As shown in equation (4), the gain of the active device can affect the noise figure of the subsequent stages. Similar to the IIP3 calculation in equation (2), the noise figure calculation in equation (4) can be carried out in sequential order for subsequent stages of the receiver.

Receivers are employed for many communication applications, such as cellular communication systems and high definition television (HDTV). Exemplary cellular communication systems include Code Division Multiple Access (CDMA) communication systems, Time Division Multiple Access (TDMA) communication systems, and analog FM communication systems. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", and U.S. Pat. No. 5,103,459, entitled "SYSTEM AND METHOD FOR GENERATING WAVEFORMS IN A CDMA CELLU- LAR TELEPHONE SYSTEM", both assigned to the assignee of the present invention and incorporated by reference herein. An exemplary HDTV system is disclosed in U.S. Pat. No. 5,452,104, U.S. Pat. No. 5,107,345, and U.S. Pat. No. 5,021,891, all three entitled "ADAPTIVE BLOCK SIZE IMAGE COMPRESSION METHOD AND SYSTEM", and U.S. Pat. No. 5,576,767, entitled "INTER-FRAME VIDEO ENCODING AND DECODING SYSTEM", all four patents are assigned to the assignee of the present invention and incorporated by reference herein.

In cellular applications, it is common to have more than one communication system operating within the same geographic coverage area. Furthermore, these systems can operate at or near the same frequency band. When this occurs, the transmission from one system can cause degradation in the received signal of another system. CDMA is a spread spectrum communication system which spreads the transmit power to each user over the entire 1.2288 MHz signal bandwidth. The spectral response of an FM-based transmission can be more concentrated at the center frequency. Therefore, FM-based transmission can cause jammers to appear within the allocated CDMA band and very close to the received CDMA signal. Furthermore, the amplitude of the jammers can be many times greater than that of the CDMA signal. These jammers can cause third-order intermodulation products which can degrade the performance of the CDMA system.

Typically, to minimize degradation due to intermodulation products caused by jammers, the receiver is designed to have high IIP3. However, design of a high IIP3 receiver requires the active devices within the receiver to be biased with high DC current, thereby consuming large amounts of power. This design approach is especially undesirable for cellular application wherein the receiver is a portable unit and power is limited.

Several techniques have been deployed in the prior art to address the need for high IIP3. One such technique, which also attempts to minimize power consumption, is to implement the gain stage with a plurality of amplifiers connected in parallel and to selectively enable the amplifiers as higher IIP3 is needed. This technique is disclosed in detail in U.S. Pat. No. 6,069,575, entitled "DUAL MODE AMPLIFIER WITH HIGH EFFICIENCY AND HIGH LINEARITY", assigned to the assignee of the present invention and incorporated by reference herein. Another technique is to measure the received RF signal power and adjust the gain of the amplifiers based on the amplitude of the RF signal power. This technique is disclosed in detail in U.S. patent application Ser. No. 08/723,491, entitled "METHOD AND APPARATUS FOR INCREASING RECEIVER POWER IMMUNITY TO INTERFERENCE", filed Sep. 30, 1996, assigned to the assignee of the present invention and incorporated by reference herein. These techniques improve the IIP3 performance but have not effectively reduced power consumption nor minimized circuit complexity.

An exemplary block diagram of a receiver architecture of the prior art is shown in FIG. 1. Within receiver 1100, the transmitted RF signal is received by antenna 1112, routed through duplexer 1114, and provided to low noise amplifier (LNA) 1116. LNA 1116 amplifies the RF signal and provides the signal to bandpass filter 1118. Bandpass filter 1118 filters the signal to remove some of the spurious signals which can cause intermodulation products in the subsequent stages. The filtered signal is provided to mixer 1120 which downconverts the signal to an intermediate frequency (IF) with the sinusoidal from local oscillator 1122. The IF signal is provided to bandpass filter 1124 which filters spurious signals and downconversion products prior to the subsequent downconversion stage. The filtered IF signal is provided to automatic-gain-control (AGC) amplifier 1126 which amplifies the signal with a variable gain to provide an IF signal at the required amplitude. The gain is controlled by a control signal from AGC control circuit 1128. The IF signal is provided to demodulator 1130 which demodulates the signal in accordance with the modulation format used at the transmitter. For digital transmission such as binary phase shift keying (BPSK), quaternary phase shift keying (QPSK), offset quaternary phase shift keying (OQPSK), and quadrature amplitude modulation (QAM), a digital demodulator is used to provide the digitized baseband data. For FM transmission, an FM demodulator is used to provide the analog signal.

Receiver 1100 comprises the basic functionalities required by most receivers. However, the location of amplifiers 1116 and 1126, bandpass filters 1118 and 1124, and mixer 1120 can be rearranged to optimize the receiver performance for a particular application. In this receiver architecture, high IIP3 is provided for by biasing the active devices at high DC bias current and/or by controlling the gain of amplifier 1126.

This receiver architecture has several drawbacks. First, the active devices are typically biased to a high DC current to provide the highest required IIP3. This has the effect of operating receiver 1100 at the high IIP3 operating point at all times, even though high IIP3 is not required most of the time. Second, the high IIP3 can be improved by adjusting the gain of AGC amplifier 1126, as disclosed in the aforementioned U.S. Pat. No. 5,099,204. However, lowering the gain of amplifier 1126 can degrade the noise figure of receiver 1100.

SUMMARY OF THE INVENTION

The present invention is a novel and improved amplifier having an adjustable current source which can be controlled to provide the requisite level of performance at reduced current consumption. The amplifier of the present invention is especially suitable for mobile communication devices. In the present invention, an amplifier is first designed using one of the many designs available and known in the art. An exemplary amplifier design is a common emitter amplifier wherein the bias (or collector) current can be provided by a current source. The bias current determines the performance of the amplifier, such as linearity and noise performance. Typically, linearity is measured by the input-referred third-order intercept point (or IIP3) and noise performance is measured by the noise figure (or NF). Generally, the linearity can be improved by biasing the amplifier with more current. However, in many communication devices and especially for mobile applications, power is a precious commodity. Thus, the bias current of the amplifier of the present invention is adjusted to provide the requisite level of performance while reducing power consumption.

The current source of the present invention is designed having minimal component count and ease of interface to the control circuitry. In the exemplary embodiment, the current source comprises at least one metal-oxide-semiconductor-field-effect-transistor (MOSFET) arranged in a series or parallel topology, or a combination of both. The MOSFETs require NO bias current and can be selected to accept a standard digital control signal. However, other active devices (such as BJT, JFET, etc.) can also be used for the current source and are within the scope of the present invention. Furthermore, the active devices (e.g., n-channel or p-channel MOSFET) can be selected based on the logic (e.g., positive or negative) of the control signals for ease of interface.

In one embodiment of the present invention, the current source is designed having discrete steps (e.g., with the MOSFETs operated as switches being ON or OFF). This embodiment results in a simple design which may be suboptimal for some applications. In another embodiment of the present invention, the current source is designed to have continuous or substantially continuous current adjustment. Small incremental adjustment steps is possible by calibrating the current source prior to use, e.g., characterizing the output current versus the input control voltages of the current source. Alternatively, a control loop can be designed to adjust the current source based on the measured and required performance of the amplifier.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIGS. 6A–6B are diagrams of the IIP3 performance versus bias current of the transistor used in the LNA and the performance curves of the LNA, respectively;

FIGS. 7A–7B are diagrams of the two-tone and single-tone jammers specifications for CDMA signal as defined by IS-98-A, respectively;

FIGS. 8A–8B are diagrams of the AGC control range for ascending and descending CDMA input power, respectively;

FIGS. 10A–10B is a diagram of the IIP3 bias control for ascending and descending CDMA input power, respectively.

DETAILED DESCRIPTION OF THE PREFERRED EMBODIMENTS

The receiver of the present invention provides the requisite level of system performance and minimizes power consumption by controlling the DC bias of the active devices. The present invention can be practiced using one of three embodiments described in detail below. In the first embodiment, the amount of non-linearity at the output of the receiver is measured and used to set the IIP3 operating point of the active devices within the receiver, such as the amplifiers and mixer. In the second embodiment, the IIP3 operating point of the active devices are set in accordance with the expected received signal level based on the operating mode of the receiver. And in the third embodiment, the IIP3 operating point of the active devices are set in accordance with the measured signal level at various stages within the receiver.

In the present invention, the AGC function is provided by an AGC control circuit which operates in conjunction with a bias control circuit. The IIP3 operating point of the active devices are set in accordance with the measured amount of non-linearity which is dependent on the amplitude of the signal. The signal amplitude, in turn, depends on the gain settings of the receiver. In the present invention, the AGC and bias control are operated in an integrated manner to provide the required level of linearity over a specified AGC range while minimizing power consumption.

I. Receiver Architecture

Figure 1:
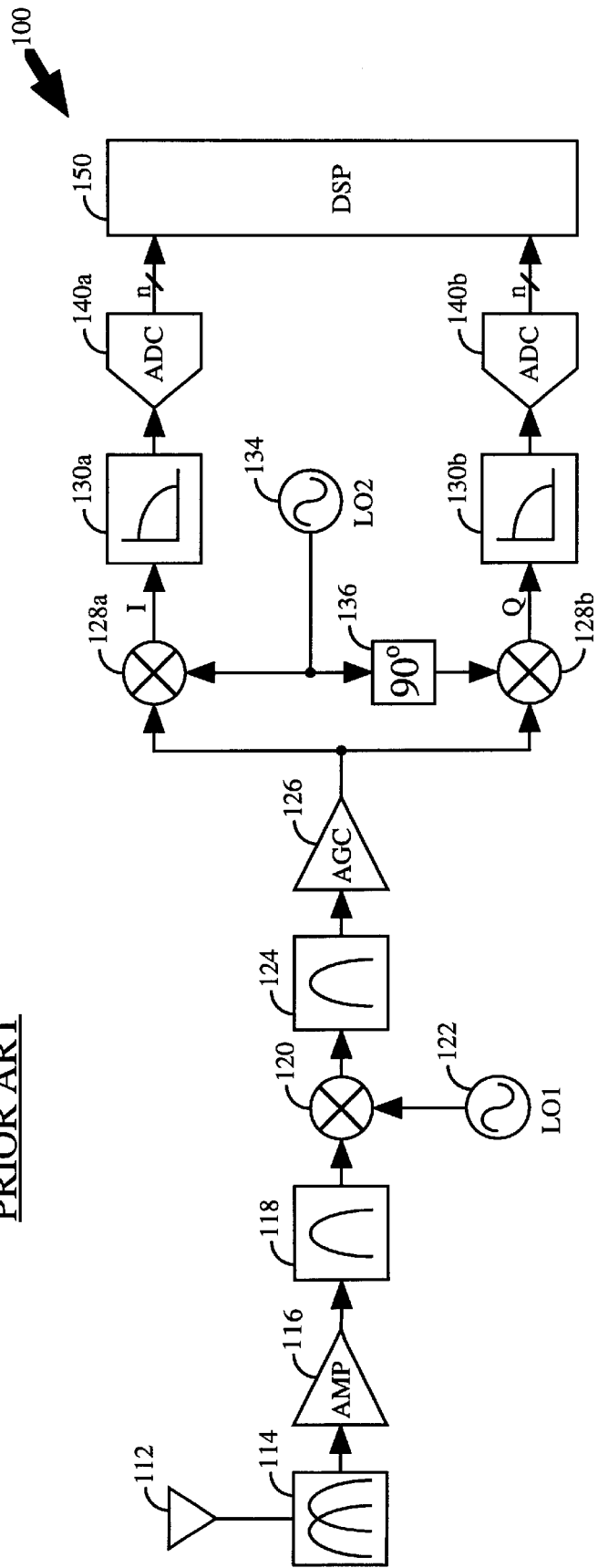
FIG. 1 is a block diagram of an exemplary receiver of the prior art.
Figure 2:
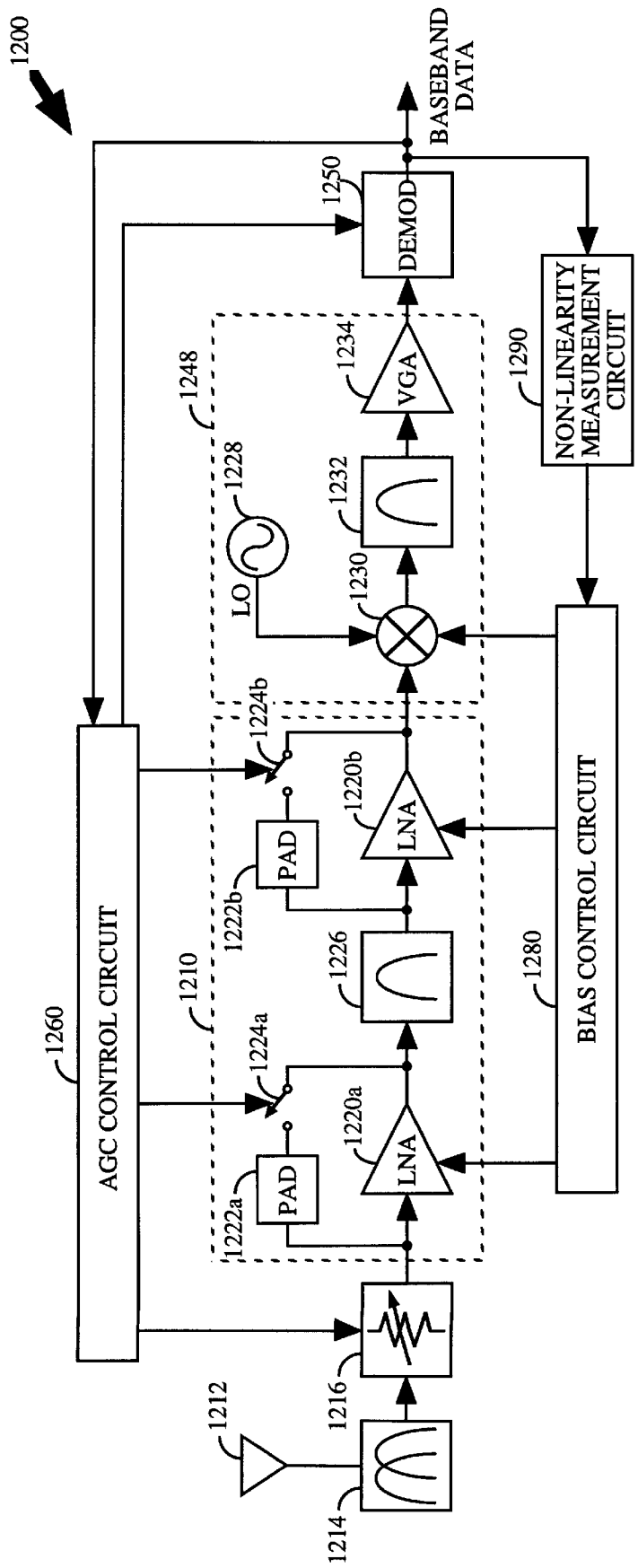
FIG. 2 is a block diagram of an exemplary programmable linear receiver of the present invention.

A block diagram of an exemplary receiver architecture of the present invention is shown in FIG. 2. Within receiver 1200, the transmitted RF signal is received by antenna 1212, routed through duplexer 1214, and provided to attenuator 1216. Attenuator 1216 attenuates the RF signal to provide a signal at the required amplitude and provides the attenuated signal to RF processor 1210. Within RF processor 1210, the attenuated signal is provided to pad 1222a and low noise amplifier (LNA) 1220a. LNA 1220a amplifies the RF signal and provides the amplified signal to bandpass filter 1226. Pad 1222a provides a predetermined level of attenuation and connects in series with switch 1224a. Switch 1224a provides a bypass route around LNA 1220a when the gain of LNA 1220a is not needed. Bandpass filter 1226 filters the signal to remove spurious signals which can cause intermodulation products in the subsequent signal processing stages. The filtered signal is provided to pad 1222b and low noise amplifier (LNA) 1220b. LNA 1220b amplifies the filtered signal and provides the signal to RF/IF processor 1248. Pad 1222b provides a predetermined level of attenuation and connects in series with switch 1224b. Switch 1224b provides a bypass route around LNA 1220b when the gain of LNA 1220b is not needed. Within RF/IF processor 1248, mixer 1230 downconverts the signal to an intermediate frequency (IF) with the sinusoidal from local oscillator (LO) 1228. The IF signal is provided to bandpass filter 1232 which filters out spurious signals and out-of-band downconversion products. In the preferred embodiment, the filtered IF signal is provided to voltage control amplifier (VGA) 1234 which amplifies the signal with a variable gain which is adjusted by a gain control signal. Amplifier 1234 can also be implemented as a fixed gain amplifier, depending on the system requirement, and this is also within the scope of the present invention. The amplified IF signal is provided to demodulator 1250 which demodulates the signal in accordance with the modulation format used by the transmitter (not shown). RF processor 1210 and RF/IF processor 1248 is collectively referred to as a front end.

Figure 4:
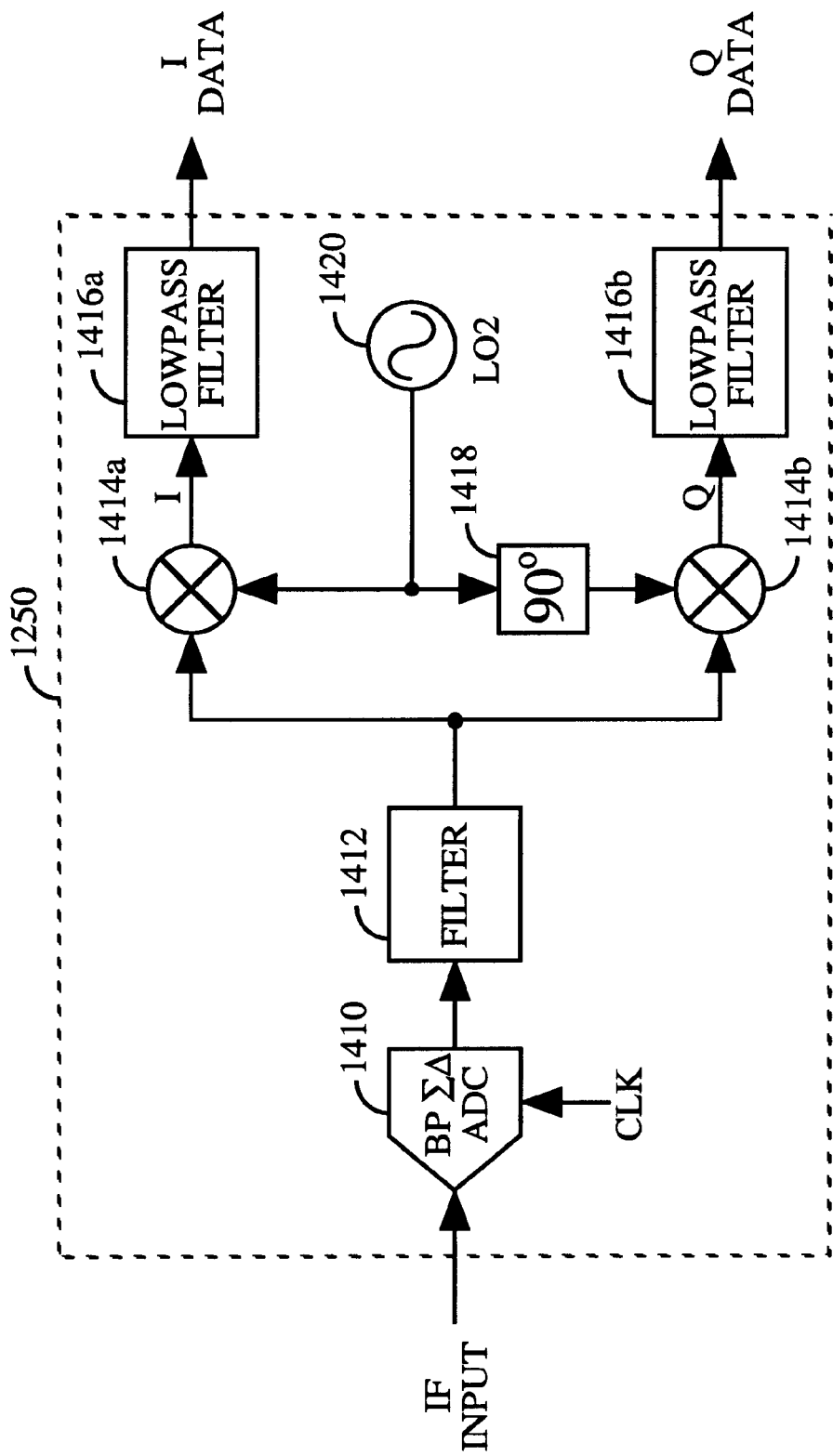
FIG. 4 is a block diagram of an exemplary QPSK demodulator which is used within the receivers of the present invention.

A block diagram of an exemplary demodulator 1250 used for demodulation of quadrature modulated signals (e.g. QPSK, OQPSK, and QAM) is illustrated in FIG. 4. In the exemplary embodiment, demodulator 1250 is implemented as a subsampling bandpass demodulator. The IF signal is provided to bandpass sigma delta analog-to-digital converter ($\Sigma\Delta$ ADC) 1410 which quantizes the signal at a high sampling frequency determined by the CLK signal. An exemplary design of a $\Sigma\Delta$ ADC is described in detail in U.S. Pat. Ser. No. 5,982,315 entitled "SIGMA-DELTA ANALOG-TO-DIGITAL CONVERTER", and assigned to the assignee of the present invention. The use of a $\Sigma\Delta$ ADC within a receiver is disclosed in copending U.S. Pat. No. 6,005,506, entitled "RECEIVER WITH SIGMA-DELTA ANALOG-TO-DIGITAL CONVERTER", assigned to the assignee of the present invention and incorporated by reference herein. The quantized signal is provided to filter 1412 which filters and decimates the signal. The filtered signal is provided to multipliers 1414a and 1414b which downconvert the signal to baseband with the in-phase and quadrature sinusoids from local oscillator (LO2) 1420 and phase shifter 1418, respectively. Phase shifter 1418 provides 90° of phase shift for the quadrature sinusoidal. The baseband I and Q signals are provided to lowpass filters 1416a and 1416b, respectively, which filter the signal to provide the I and Q data. The baseband data in FIG. 2 comprises the I and Q data in FIG. 4. In the exemplary embodiment, filter 1412 and/or lowpass filters 1416 also provide scaling of the signal to enable demodulator 1250 to provide baseband data at various amplitudes. Other implementations of demodulator 1250 can be designed to performed the demodulation of QPSK modulated waveform and are within the scope of the present invention.

Referring back to FIG. 2, receiver 1200 comprises the basic functionalities required by most receivers. However, the arrangement of attenuator 1216, LNAs 1220a and 1220b, bandpass filters 1226 and 1232, and mixer 1230 can be reordered to optimize the performance of receiver 1200 for specific applications. For example, attenuator 1216 can be interposed between LNA 1220a and bandpass filter 1226 to improve the noise figure performance. Furthermore, a bandpass filter can be inserted before LNA 1220a to remove undesirable spurious signals before the first amplifier stage. Different arrangements of the functionalities shown herein can be contemplated and are within the scope of the present invention. Furthermore, other arrangements of the functionalities shown herein in combination with other receiver functionalities which are known in the art can also be contemplated and are within the scope of the present invention.

In the present invention, attenuator 1216, switches 1224a and 1224b, and demodulator 1250 are controlled by AGC control circuit 1260 such that the IF signal from amplifier 1234 is at the required amplitude. The AGC function is described in detail below. In the exemplary embodiment, LNAs 1220a and 1220b are fixed gain amplifiers. LNAs 1220a and 1220b and mixer 1230 are controlled by bias control circuit 1280 to adjust the DC bias current and/or voltages of these active devices such that the required linearity performance is achieved with minimal power consumption. The variable IIP3 bias control mechanism is described in detail below.

The receiver architecture of the present invention can be adopted for use in various applications, including cellular telephone and HDTV applications. In the cellular telephone, receiver 1200 can be adopted for use in CDMA communication systems operating at the personal communication system (PCS) band or the cellular band.

Figure 3:
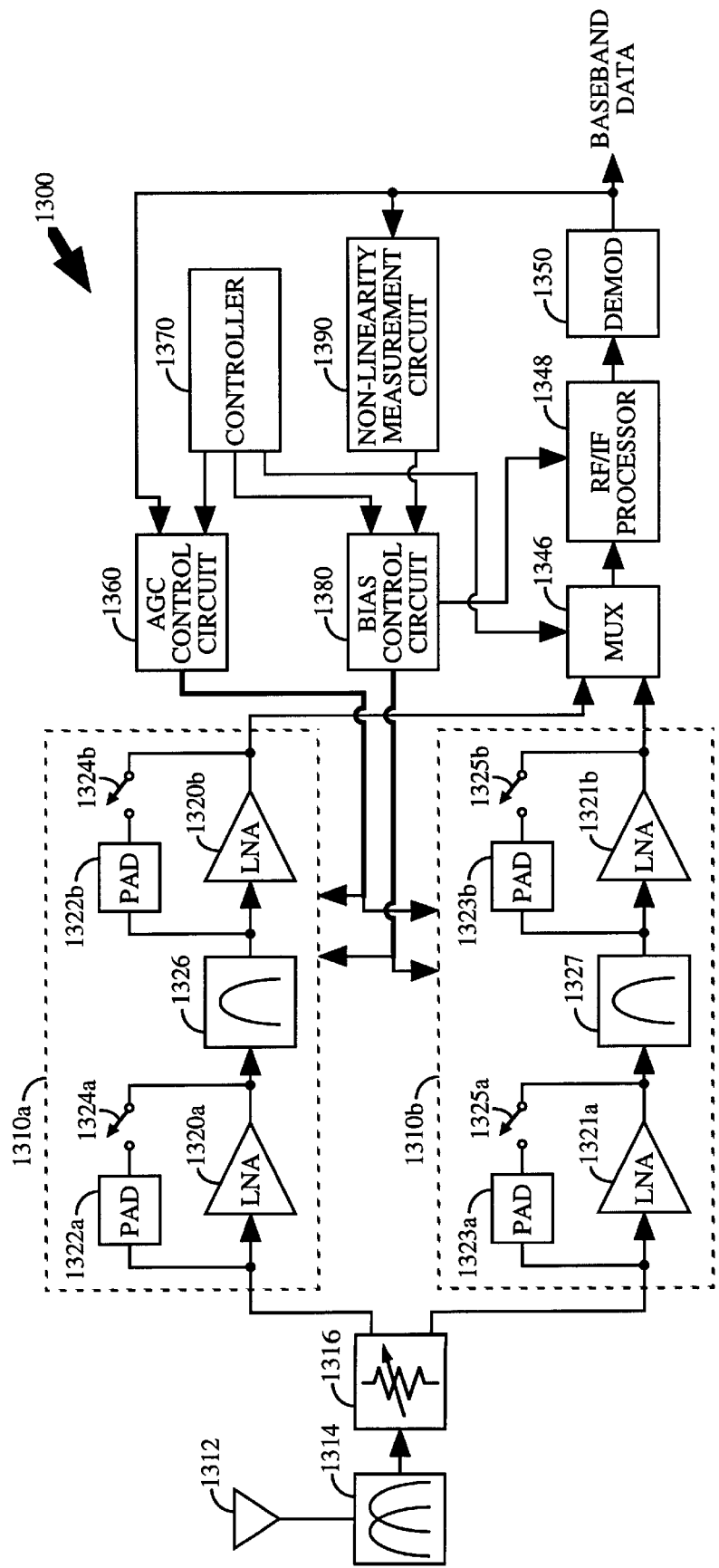
FIG. 3 is a block diagram of an exemplary programmable linear dual-band receiver of the present invention.

A block diagram of an exemplary receiver which supports dual-band (PCS and cellular) and dual-mode (CDMA and AMPS) is shown in FIG. 3. The PCS band has a bandwidth of 60 MHz and a center frequency of 1900 MHz. The cellular band has a bandwidth of 25 MHz and a center frequency of 900 MHz. Each band requires a unique RF bandpass filter. Therefore, two RF processors are used for the two bands.

Receiver 1300 comprises many of the same components as those in receiver 1200 (see FIG. 2). Antenna 1312, duplexer 1314, and attenuator 1316 are identical to antenna 1212, duplexer 1214, and attenuator 1216 in receiver 1200. The attenuated signal from attenuator 1316 is provided to RF processors 1310a and 1310b. RF processor 1310a is designed to operate at the cellular band and RF processor 1310b is designed to operate at the PCS band. RF processor 1310a is identical to RF processor 1210 in receiver 1200. RF processor 1310a comprises two stages of low-noise amplifier (LNA) 1320a and 1320b connected in cascade with bandpass filter 1326 interposed between the stages. Each LNA 1320 has a parallel signal path comprising pad 1322 and switch 1324. RF processor 1310b is similar to RF processor 1310a except that LNAs 1321a and 1321b and bandpass filter 1327 are designed to operate at the PCS band. The output from RF processors 1310a and 1310b are provided to multiplexer (MUX) 1346 which selects the desired signal in accordance with a control signal from controller 1370 (not shown in FIG. 3 for simplicity). The RF signal from MUX 1346 is provided to RF/IF processor 1348 which is identical to RF/IF processor 1248 in FIG. 2. The IF signal from processor 1348 is provided to demodulator (DEMOD) 1350 which demodulates the signal in accordance with the modulation format used at the remote transmitter (not shown). Demodulator 1350, AGC control circuit 1360, bias control circuit 1380, and non-linearity measurement circuit 1390 in FIG. 3 are identical to demodulator 1250, AGC control circuit 1260, bias control circuit 1280, and non-linearity measurement circuit 1290 in FIG. 2, respectively.

Controller 1370 connects to AGC control circuit 1360, bias control circuit 1380, and MUX 1346 and controls the operation of these circuits. Controller 1370 can be implemented as a microprocessor, a microcontroller, or a digital signal processor programmed to perform the functions herein described. Controller 1370 can also comprise a memory storage element for storing the operating modes of receiver 1300 and the associated control signals.

Referring to FIG. 2, an exemplary design of receiver 1200 especially adopted for cellular telephone application is given in detail below. In the exemplary embodiment, attenuator 1216 has an attenuation range of 20 dB and provides an attenuation of 0.2 dB to −20 dB. Attenuator 1216 can be designed with a pair of diodes or by field effect transistors (FETs), the implementations of which are known in the art. In the exemplary embodiment, LNAs 1220a and 1220b have fixed gains of 13 dB each. LNAs 1220a and 1220b can be off-the-shelf monolithic RF amplifiers or amplifiers designed using discrete components. An exemplary discrete design of LNA 1220 is given in detail below. In the exemplary embodiment, pads 1222a and 1222b provide 5 dB of attenuation and can be implemented with resistors in the manner known in the art. In the exemplary embodiment, bandpass filter 1226 is a surface acoustic wave (SAW) filter which has a bandwidth of 25 MHz, the entire bandwidth of the cellular band, and is centered about 900 MHz.

In the exemplary embodiment, bandpass filter 1232 is also a SAW filter which has a bandwidth of 1.2288 MHz, the bandwidth of one CDMA system, and is centered about 116.5 MHz. Mixer 1230 is an active mixer which can be an off-the-shelf mixer, such as the Motorola MC13143, or other active mixer which is designed in the manner known in the art. Mixer 1230 can also be implemented with passive components, such as double-balanced diode mixer. Amplifier 1234 can be a monolithic amplifier or an amplifier designed with discrete components. In the exemplary embodiment, amplifier 1234 is designed to provide a gain of 40 dB.

In the exemplary embodiment, the overall gain range of receiver 1200, excluding demodulator 1250, is +51 dB to −5 dB. This gain range presumes exemplary insertion loss of −3 dB for bandpass filter 1226, gain of +1 dB for mixer 1230, and insertion loss of −13 dB for bandpass filter 1232. For CDMA applications, an AGC range of 80 dB is typically required to adequately handle path loss, fading conditions, and jammers. In the exemplary embodiment, the AGC range provided by attenuator 1216, LNAs 1220*a* and 1220*b*, and pads 1222*a* and 1222*b* is 56 dB. In the exemplary embodiment, the remaining 24 dB of AGC range is provided by demodulator 1250 and/or amplifier 1234. Within demodulator 1250 (see FIG. 4), ADC 1410 quantizes the analog waveform and provides the digitized values to the subsequent digital signal processing blocks. In the exemplary embodiment, the required resolution for ADC 1410 is four bits. In the exemplary embodiment, an additional six bits of resolution provides headroom for the yet unfiltered jammers. ADC 1410 can be designed to provide more than ten bits of resolution. Each additional bit over ten can be used to provide 6 dB of gain control. Fortunately, at high CDMA signal levels, the out-of-band jammer levels cannot continue to be +72 dB above the CDMA signal. Therefore, when the CDMA signal is strong, the jammers require less than 6 bits of resolution for jammer headroom. In the exemplary embodiment, the AGC function performed in demodulator 1250 is active only when the CDMA signal is strong, e.g., at the high end of the CDMA control range. Thus, the extra bits of resolution which are initially reserved for jammer headroom are now used for the AGC function as the result of the strong CDMA signal levels.

II. Amplifier Design

Figures 5A, 5B:
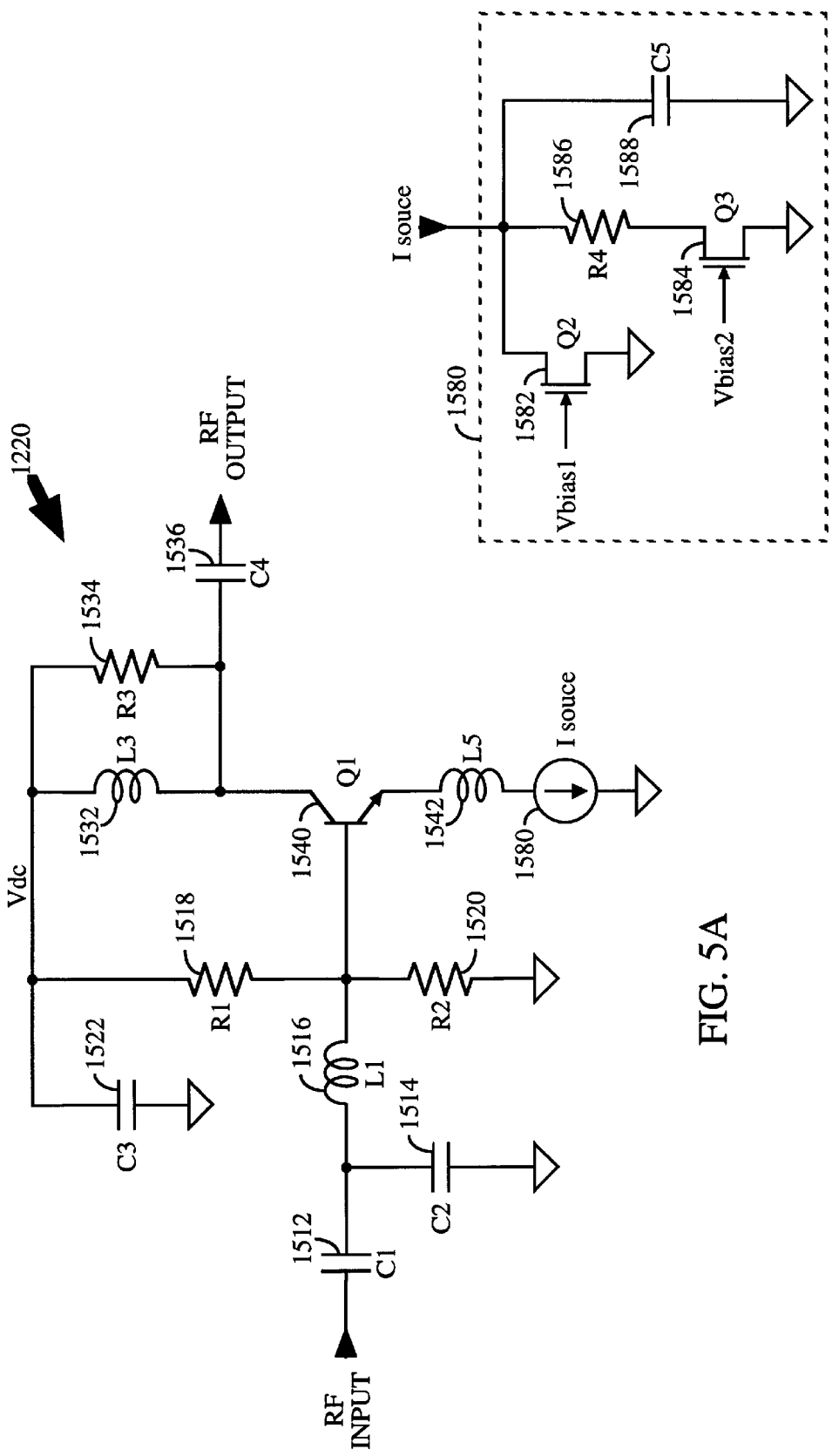
FIGS. 5A–5B are schematic diagrams of an exemplary discrete design of low-noise-amplifier (LNA) and current source which are used in the receivers of the present invention, respectively.

A schematic diagram of an exemplary discrete LNA design is shown in FIG. 5A. Within LNA 1220, the RF input is provided to one end of AC coupling capacitor 1512. The other end of capacitor 1512 connects to one end of capacitor 1514 and inductor 1516. The other end of capacitor 1514 connects to analog ground and the other end of inductor 1516 connects to one end of resistors 1518 and 1520 and the base of transistor 1540. The other end of resistor 1518 connects to the power supply Vdc and the other end of resistor 1520 connects to analog ground. Bypass capacitor 1522 connects to Vdc and analog ground. In the exemplary embodiment, transistor 1540 is a low noise RF transistor, such as the Siemens BFP420, which is commonly used in the art. The emitter of transistor 1540 connects to one end of inductor 1542. The other end of inductor 1542 connects to current source 1580 which also connects to analog ground. The collector of transistor 1540 connects to one end of inductor 1532, resistor 1534, and capacitor 1536. The other end of inductor 1532 and resistor 1534 connect to Vdc. The other end of capacitor 1536 comprises the RF output.

Within LNA 1220, capacitors 1512 and 1536 provide AC coupling of the RF input and output signals, respectively. Capacitor 1514 and inductor 1516 provide noise matching. Inductors 1516 and 1532 also provide matching of the LNA input and output, respectively. Inductor 1532 also provides a DC path for the bias current of transistor 1540. Inductor 1542 provides degeneration of the emitter impedance to improve linearity. Resistors 1518 and 1520 set the DC bias voltage at the base of transistor 1540. Resistor 1534 determines the gain of LNA 1220 and the output impedance. Current source 1580 controls the bias current of transistor 1540 which determines the IIP3 of LNA 1220.

A schematic diagram of an exemplary current source 1580 is shown in FIG. 5B. The sources of n-channel MOSFETs 1582 and 1584 are connected to analog ground. The drain of MOSFET 1584 is connected to one end of resistor 1586. The other end of resistor 1586 connects to the drain of MOSFET 1582 and comprises the output of current source 1580. Bypass capacitor 1588 connects across the output of current source 1580 and analog ground. The gate of MOSFET 1582 is connected to Vbias1 and the gate of MOSFET 1584 is connected to Vbias2.

MOSFETs 1582 and 1584 provide the collector bias current Icc for transistor 1540 which, in turn, determines the IIP3 operating point of LNA 1220. The gates of MOSFETs 1582 and 1584 are connected to a control voltages Vbias1 and Vbias2, respectively. When Vbias1 is low (e.g. 0V), MOSFET 1582 is turned OFF and provides no collector bias current Icc for transistor 1540. When Vbias1 is high (e.g. approaching Vdc), MOSFET 1582 is turned ON and provides the maximum collector bias current for transistor 1540. Thus, Vbias1 determines the amount of collector bias current Icc provided by MOSFET 1582. Similarly, Vbias2 determines the amount of collector bias current provided by MOSFET 1584. However, the voltage at the base of transistor 1540 and the value of resistor 1586 limit the maximum collector bias current provided by MOSFET 1584.

The IIP3 performance of LNA 1220 versus collector bias current Icc is illustrated in FIG. 6A. Notice that the IIP3 increases approximately 6 dB per octave increase (or doubling) in collector bias current. The collector bias current of transistor 1540, the gain of LNA 1220, and the IIP3 of LNA 1220 versus the control voltage Vbias1 are illustrated in FIG. 6B. Notice that the gain is approximately constant (e.g. gain variation of approximately 1 dB for all Vbias1 voltages). Also, note that the IIP3 varies in similar manner with the collector bias current Icc. Thus, the collector bias current can be decreased, if high IIP3 is not required, with minimal effect on the gain of LNA 1220.

FIGS. 5A and 5B illustrate an exemplary design of LNA 1220 and current source 1580, respectively. LNA 1220 can be designed using other topologies to provide the necessary performance (e.g. higher gain, improved noise figure, better matching). LNA 1220 can be designed with other active devices, such as bipolar-junction transistors (BJT), heterojunction-bipolar transistors (HBT), metal-oxide-semiconductor field effect transistor (MOSFET), gallium arsenide field effect transistor (GaAsFET), or other active devices. LNA 1220 can also be implemented as monolithic amplifier in the manner known in the art. Similarly, current source 1580 can be designed and implemented in other manners known in the art. The various implementations of LNA 1220 and current source 1580 are within the scope of the present invention.

III. Variable IIP3 Bias Control

As described above, in-band intermodulation products can be created by spurious signals passing through non-linear devices. One application which has a demanding linearity requirement is a CDMA communication system which is co-located with other cellular telephone systems, such as the Advance Mobile Phone System (AMPS). The other cellular telephone systems can transmit spurious signals (or jammers) at high power near the operating band of the CDMA system, thereby necessitating high IIP3 requirement on the CDMA receiver.

The spurious signal rejection requirement for a CDMA system is defined by two specifications, a two-tone test and a single-tone test, in the "TIA/EIA/IS-98-A Intermodulation Spurious Response Attenuation", hereinafter the IS-98-A standard. The two-tone test is illustrated in FIG. 7A. The two tones are located at $f_1=+900$ KHz and $f_2=+1700$ KHz from the center frequency of the CDMA waveform. The two tones are equal in amplitude and 58 dB higher than the amplitude of the CDMA signal. This test simulates an FM-modulated signal being transmitted on the adjacent channel, such as the signal from an AMPS system. The FM-modulated signal contains the bulk of the power in the carrier whereas the power in the CDMA waveform is spread across the 1.2288 MHz bandwidth. The CDMA signal is more immune to channel condition and is maintained at a low power level by a power control loop. In fact, the CDMA signal is maintained at the minimal power level necessary for a requisite level of performance to reduce interference and increase capacity.

The single-tone test is illustrated in FIG. 7B. The single tone is located at $f_1$=+900 KHz from the center frequency of the CDMA waveform and has an amplitude of +72 dBc higher than the amplitude of the CDMA signal.

In accordance with IS-98-A, the linearity of the receiver is specified at the CDMA input power level of −101 dBm, −90 dBm, and −79 dBm. For the two-tone test, the jammers are at −43 dBm, −32 dBm, and −21 dBm (+58 dBc), and the in-band equivalent signal of the intermodulation products are at −104 dBm, −93 dBm, and −82 dBm, for the input power level of −101 dBm, −90 dBm, and −79 dBm, respectively.

As illustrated in FIG. 7A, the spurious tones (or jammers) at $f_1$=+900 KHz and $f_2$=+1700 KHz produce third order intermodulation products at $(2f_1-f_2)$=+100 KHz and $(2f_2-f_1)$=+2500 KHz. The product at +2500 KHz can be easily filtered by the subsequent bandpass filters 1226 and 1232 (see FIG. 2). However, the product at +100 KHz falls within the CDMA waveform and degrades the CDMA signal.

To minimized degradation in the performance of receiver 1200, the IIP3 of the active devices within receiver 1200 is adjusted in accordance with the amount of non-linearity in the received signal. Receiver 1200 is designed to meet the two-tone intermodulation specification. However, in practice, the jammers are present for only a fraction of the operating time of receiver 1200. Furthermore, the amplitude of the jammers will rarely reach the +58 dB level as specified. Therefore, to design for the worse case jammers and to operate receiver 1200 in the high IIP3 mode in anticipation of the worse case jammers is a waste of battery power.

In the present invention, the IIP3 of the active devices, in particular LNA 1220*b* and mixer 1230, are adjusted in accordance with the measured non-linearity in the output signal from receiver 1200. In the exemplary embodiment, the non-linearity is measured by the RSSI slope method. The measurement of the RSSI slope is described in detail in U.S. Pat. No. 5,107,225, entitled "HIGH DYNAMIC RANGE CLOSED LOOP AUTOMATIC GAIN CONTROL CIRCUIT", issued Apr. 21, 1992, assigned to the assignee of the present invention and incorporated by reference herein. Referring to FIG. 2, bandpass filter 1232 has a bandwidth of 1.2288 MHz and suppresses most of the jammers and out-of-band intermodulation products. Intermodulation products which fall in-band cannot be suppressed and add to the CDMA waveform. The IF signal from amplifier 1234 is provided to demodulator 1250 which processes the IF signal and provides the digitized baseband data which comprises the I and Q data. The baseband data is provided to non-linearity measurement circuit 1290. In the exemplary embodiment, non-linearity measurement circuit 1290 computes the power of the signal in accordance with the following equation:

$$P=(I^2+Q^2), \quad (5)$$

where P is the power of the baseband signals, and I and Q are the amplitude of the I and Q signals, respectively. The power measurement is provided to bias control circuit 1280.

The power measurement contains the power of the desired baseband I and Q signals as well as the power of the intermodulation products. As described above, for second order non-linearity, the intermodulation products increase two dB for each dB increase in the input signal level. For third order non-linearity, the intermodulation products increase three dB for each dB increase in the input signal level. Thus, the amount of intermodulation can be estimated by measurement of the RSSI slope which is defined as the change in the output signal level versus the change in the input signal level. The change in the input signal level can be set at a predetermined increment (e.g. 0.5 dB). For receiver 1200 operating in the linear range, 0.5 dB increase in the input signal level corresponds to 0.5 dB increase in the output signal level and an RSSI slope of 1.0. However, as one or more active devices transitions into the non-linear operating region, the RSSI slope increases. A higher RSSI slope corresponds to greater level of non-linearity. An RSSI slope of 3.0 corresponds to receiver 1200 operating in total compression (e.g. no increase in the desired output signal level as the input is increased) and the output being dominated by third order intermodulation products.

In the present invention, the RSSI slope can be compared against a predetermined RSSI threshold. If the RSSI slope exceeds the threshold, the IIP3 of the proper active device is increased. Alternatively, if the RSSI slope is below the RSSI threshold, the IIP3 is decreased. The RSSI threshold can be adjusted during operation of receiver 1200 based on the required bit-error-rate (BER) or frame-error-rate (FER) performance. A higher RSSI threshold allows for higher level of intermodulation products before increasing the IIP3, thereby minimizing power consumption at the expense of BER or FER performance. The RSSI threshold can also be adjusted by a control loop which sets the threshold for a required level of performance (e.g. 1% FER). In the exemplary embodiment, the RSSI slope is selected to be 1.2. However, the use of other RSSI thresholds are within the scope of the present invention.

In the present invention, it is not critical to measure the amplitude of the jammers directly. It is more important to measure the undesirable effect of the jammers, in terms of higher level of intermodulation products, on the desired signal. The RSSI slope is one method for measuring the level of non-linearity. The level of non-linearity can also be measured by calculating the change in the energy-per-chip-to-noise-ratio (Ec/Io) of the output signal for an incremental change in the amplitude of the input signal. The intermodulation products increase by a factor of three to one when receiver 1200 is in compression and the output signal is dominated by third order intermodulation products. As with the RSSI slope method, the level of non-linearity can be estimated by the change in Ec/Io versus the change in the input signal level. Other methods to measure the level of non-linearity can be contemplated and are within the scope of the present invention.

In the exemplary embodiment, to maximize performance, the IIP3 of the active devices are adjusted in a accordance with the amount of non-linearity (e.g. through measurement of the RSSI slope) experienced by each active device. LNAs 1220*a* and 1220*b* provide a fixed gain. Thus, mixer 1230 experiences the largest signal level, LNA 1220*b* experiences the next largest signal level, and LNA 1220*a* experiences the smallest signal level (this presumes that the gain of LNA 1220*a* is larger than the insertion loss of bandpass filter 1226). With these assumptions, the IIP3 operating point of mixer 1230 is increased first if a jammer is detected (e.g. through high RSSI slope measurement). Once the IIP3 of mixer 1230 is fully adjusted (e.g. to the highest IIP3 operating point), the IIP3 of LNA 1220*b* is increased. Finally, once the IIP3 of LNA 1220*b* is fully adjusted, the IIP3 of LNA 1220*a* can be increased. In the exemplary embodiment, LNA 1220*a* is maintained at a predetermined IIP3 operating point to optimize the performance of receiver 1200. In the complementary manner, the IIP3 of LNA 1220*b* is decreased first if no jammer is detected. Once the IIP3 of LNA 1220*b* is fully adjusted (e.g. to the lowest IIP3 operating point), the IIP3 of mixer 1230 is decreased.

The IIP3 of LNA 1220*b* and mixer 1230 can be adjusted in continuous manner (e.g. by providing for continuous Vbias1 and Vbias2 control voltages) or in discrete steps. The present invention is directed to the use of continuous, discrete steps, or other methods for controlling the IIP3 of the active devices.

The above described order of IIP3 adjustment presumes that IIP3 is the only consideration. However, different applications may experience different input conditions and have different performance requirements. The order of IIP3 adjustment can be rearranged to meet these requirements. Furthermore, the IIP3 adjustment can be reversed in direction from that described above (e.g. decreasing IIP3 for increasing input signal level) to optimize the performance of receiver 1200 for a particular operating condition. Different order of IIP3 adjustment and different direction of IIP3 adjustment are within the scope of the present invention.

IV. Gain Control

Most receivers are designed to accommodate a wide range of input signal levels. For CDMA receivers, the required AGC range is nominally 80 dB. In the exemplary embodiment of the present invention (see FIG. 2), the AGC range is provided by attenuator 1216, LNAs 1220*a* and 1220*b*, pads 1222*a* and 1222*b*, demodulator 1250, and possibly amplifier 1234. In the exemplary embodiment, attenuator 1216 provides an AGC range of 20 dB, pad 1222*a* and 1222*b* each provide an AGC range of 5 dB, LNA 1220*a* and 1220*b* each provide an AGC range of 13 dB, and amplifier 1234 and/or demodulator 1250 provides an AGC range of 24 dB. The AGC range of one or more of these components can be adjusted and are within the scope of the present invention. Furthermore, amplifier 1234 can be designed to provide an AGC range to supplements those of other components. For example, the AGC range of pads 1222 can be reduced to 2 dB each and amplifier 1234 can be designed with 6 dB of AGC range.

In the exemplary embodiment, the first 2 dB of AGC range is provided by demodulator 1250. Demodulator 1250 comprises bandpass subsampling ΣΔ ADC 1410 which provides additional bits of resolution which can be used for AGC control. The next 20 dB of AGC range is provided by attenuator 1216 and/or amplifier 1234. The next 18 dB of AGC range is provided by LNAs 1220*a* and pad 1222*a*. The next 18 dB of AGC range is provided by LNAs 1220*b* and pad 1222*b*. And the remaining 22 dB of AGC range is provided by amplifier 1234 and/or demodulator 1250.

An exemplary diagram illustrating the AGC control operation of receiver 1200 of the present invention for ascending CDMA input signal power is illustrated in FIG. 8A. In this example, amplifier 1234 is implemented as a fixed gain amplifier for simplicity. The CDMA input power level can range from −104 dBm to −24 dBm. From −104 dBm to −102 dBm, LNAs 1220*a* and 1220*b* are turned ON, switches 1224*a* and 1224*b* are switched OFF, and the AGC is provided by demodulator 1250. From −102 dBm to −85 dBm the AGC is provided by attenuator 1216. From −84 dBm to −62 dBm, LNA 1220*a* is turned OFF, switch 1224*a* is switched ON, LNA 1220*b* remains ON, switch 1224*b* remains OFF, and the AGC is provided by attenuator 1216. From −63 dBm to −46 dBm, LNAs 1220*a* and 1220*b* are turned OFF, switches 1224*a* and 1224*b* are switched ON, and the AGC is provided by attenuator 1216. Finally, above −46 dBm, attenuator 1216 is fully attenuated, the IF signal level into demodulator 1250 increases dB per dB with the input RF signal level, and the AGC is provided after ADC 1410 by demodulator 1250.

An exemplary diagram illustrating the AGC control operation of receiver 1200 for descending CDMA signal power is illustrated in FIG. 8B. Again, amplifier 1234 is implemented as a fixed gain amplifier in this example for simplicity. From −24 dBm to −46 dBm, LNAs 1220*a* and 1220*b* are turned OFF, switches 1224*a* and 1224*b* are switched ON, and the AGC is provided after ADC 1410 by demodulator 1250. From −46 dBm to −66 dBm, the AGC is provided by attenuator 1216. From −66 dBm and −69 dBm, attenuator 1216 is at the minimum attenuation state and the AGC is provided by demodulator 1250. At −70 dBm, LNA 1220*b* is turned ON and switch 1224*b* is switched OFF. From −70 dBm to −84 dBm, the AGC is provided by attenuator 1216. From −84 dBm to −90 dBm, the AGC is provided by demodulator 1250. At −91 dBm, LNA 1220*a* is turned ON and switch 1224*a* is switched OFF. From −91 dBm to −102 dBm, the AGC is provided by attenuator 1216. And from −102 dBm to −104 dBm, the AGC is provided by demodulator 1250.

FIGS. 8A–8B illustrate the input RF signal levels where LNAs 1220*a* and 1220*b* are turned ON and OFF. LNA 1220*a* is turned OFF as the input signal level exceeds −85 dBm (see FIG. 8A) but is not turned ON again until the signal level decreases past −91 dBm. The 6 dB of hysteresis prevents LNA 1220*a* from toggling between the ON and OFF states. LNA 1220*b* also is provided with 6 dB of hysteresis for the same reason. Different amounts of hysteresis can be used to optimize system performance and are within the scope of the present invention.

The discussion above illustrates an exemplary implementation of the required AGC control. The AGC control can also be implemented with AGC amplifiers having adjustable gains. Furthermore, the arrangement of attenuator 1216 and LNAs 1220*a* and 1220*b* as illustrated in FIG. 2 is just one implementation which satisfies the CDMA specification. Other implementations of the AGC functionalities using the elements described herein, and other implementations using these elements in combination with other elements or circuits which are known in the art, are within the scope of the present invention.

V. Receiver Setting According to Measured Non-Linearity

Figure 9:
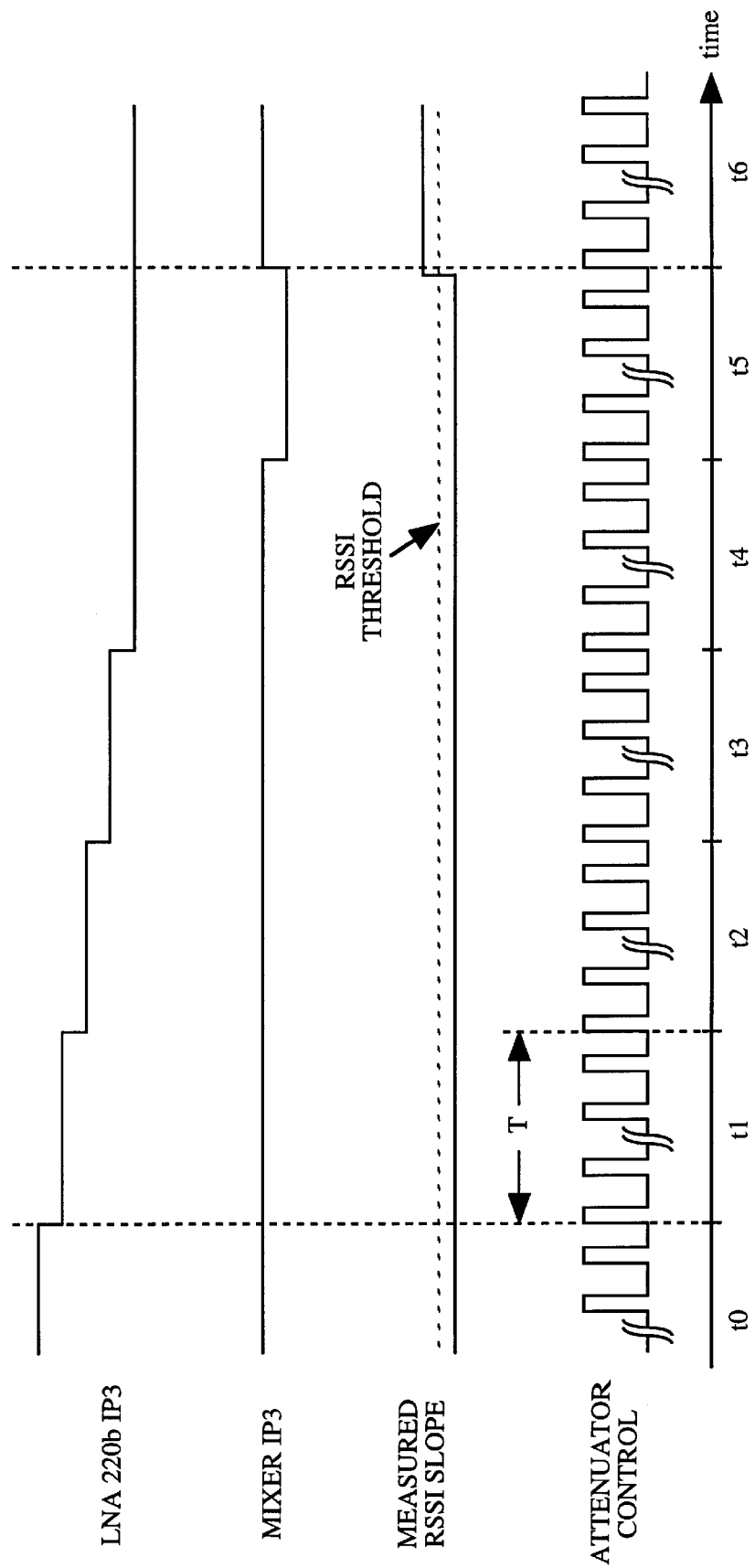
FIG. 9 is a diagram of an exemplary IIP3 bias control mechanism of the present invention.

In the first embodiment of the present invention, the IIP3 of the active devices are set in accordance with the measured level of non-linearity produced by receiver 1200. The level of non-linearity can be estimated by the RSSI slope or by Ec/Io measurement. The timing diagram of an exemplary RSSI slope measurement implementation is illustrated in FIG. 9. In the exemplary embodiment, the input RF signal level is changed by varying the attenuation of attenuator 1216 in narrow pulses. Each pulse is referred to as a "wiggle". The RSSI slope is measured for each pulse and the measurements are averaged over a predetermined period T to improve the accuracy of the RSSI slope measurement. At the end of the period T, the measured RSSI slope is compared to the RSSI threshold and the result is used to adjust the IIP3 of the active devices in the manner described above.

As shown in FIG. 9, the RSSI slope measurement at $T_0$ is less than the RSSI threshold, indicating that receiver 1200 is operating within the linear limit. Thus, the IIP3 of LNA 1220*b* is decreased to conserve power consumption. Similarly, at the end of periods $T_1$, $T_2$, and $T_3$, the measured RSSI slope is less than the RSSI threshold and the IIP3 of LNA 1220*b* continues to be decreased. At the end of period $T_4$, the measured RSSI slope is still less than the RSSI threshold and the IIP3 of mixer 1230 is decreased since the IIP3 of LNA 1220*b* has been adjusted fully to the minimal IIP3 operating point. At the end of period $T_5$, the measured RSSI slope is greater than the RSSI threshold, indicating that the intermodulation products has increased to an unacceptable level. The IIP3 of mixer 1230 is increased to improve linearity in response thereto.

In the exemplary embodiment, each pulse is 200 μsec in duration, the period T is 5 msec, and the number of pulses within one period T is nine. Using these values, the duty cycle is 36 percent. In the preferred embodiment, the duty cycle of the pulses should be low enough so that the Ec/Io of the desired signal is minimally degraded by the periodic perturbation in the signal amplitude. The width of the pulses is selected to be short in duration to minimize disturbance to AGC control circuit 1280. Typically, the AGC control loop is slow and cannot track the changes in signal level caused by the short attenuation pulses. This is particularly important since the change in the amplitude of the output signal should accurately reflect the changes in the amplitude of the input signal and the intermodulation products, and not the changes caused by AGC control circuit 1280. However, short pulse width results in less accurate measurement of the output signal power. The present invention is directed at the use of pulses of various widths and various duty cycles for the functions described herein.

The amplitude of the perturbation in the input RF signal level is selected to be small to minimize degradation in the output signal and to minimize effect on the IIP3 of the entire receiver 1200. In the exemplary embodiment, the attenuation step for RSSI slope measurement is 0.5 dB.

Other values for the attenuation step can be used and are within the scope of the present invention.

In the exemplary embodiment, the RSSI threshold is selected to be 1.2. The use of one RSSI threshold can result in toggling the IIP3 operating points between successive periods T. To prevent this, two RSSI thresholds can be used to provide hysteresis. The IIP3 is not increased unless the measured RSSI slope exceeds the first RSSI threshold and the IIP3 is not decreased unless the measured RSSI slope is below the second RSSI threshold. The use of a single threshold or multiple thresholds are within the scope of the present invention.

A diagram illustrating the IIP3 bias control operation of receiver 1200 of the present invention for ascending input RF power level is shown in FIG. 10A. The input RF signal comprises a CDMA signal and two-tone jammers which are +58 dBc above the CDMA signal. When the CDMA signal power is between −104 dBm and −101 dBm, the IIP3 of mixer 1230 is set at +10 dBm and the IIP3 of LNAs 1220*a* and 1220*b* are set at 0 dBm. As the CDMA signal increases past −101 dBm, the measured RSSI slope exceeds the RSSI threshold, and the IIP3 of mixer 1230 is increased to +15 dBm to minimize the level of non-linearity. Attenuator 1216 provides attenuation of the input RF signal between −104 dBm and −84 dBm. At −84 dBm, LNA 1220*a* is bypassed and attenuator 1216 resets to its low attenuation state. When the CDMA signal power is at −83 dBm, −79 dBm, −75 dBm, and −71 dBm, the IIP3 of LNA 1220*b* is increased to minimize intermodulation products. At approximately −64 dBm, LNA 1220*b* is bypassed and attenuator 1216 again resets to its low attenuation state.

A diagram illustrating the IIP3 bias control operation of receiver 1200 for descending input RF power level is shown in FIG. 10B. Again, the input RF signal comprises a CDMA signal and two-tone jammers which are +58 dBc above the CDMA signal. Initially, when the CDMA input signal power is at −60 dBm, LNAs 1220*a* and 1220*b* are bypassed. When the CDMA signal power decreases to −70 dBm, LNA 1220*b* is turned ON to provide the necessary gain. At approximately −76 dBm, −80 dBm, −84 dBm, and −88 dBm, the IIP3 of LNA 1220*b* is decreased to minimize power consumption. At −90 dBm, attenuator 1216 reaches its upper attenuation range and LNA 1220*a* is turned ON. At −100 dBm, the IIP3 of mixer 1230 is decreased to conserve power since the input RF signal level is small.

As discussed above, the input RF power level where the IIP3 of mixer 1230 and LNAs 1220*a* and 1220*b* are adjusted are determined by the measured RSSI slope. The RSSI slope measurement may not result in linearly spaced IIP3 bias switch points as shown in FIG. 10A. Furthermore, the stepwise switch points can be replaced with continuously adjustable bias control.

VI. Receiver Setting According to Operating Mode

In the second embodiment of the present invention, the IIP3 of the active devices are set in accordance with the operating mode of the receiver. As stated above, receiver 1300 (see FIG. 3) can be used in a cellular telephone which is required to operate in either PCS or cellular band. Each band can support either digital and/or analog platforms. Each platform can further comprise a variety of operating modes. The various operating modes are utilized to improve performance and conserve battery power. For example, different operating modes are used to support the following features of a cellular telephone: (1) slotted mode paging for longer stand-by time, (2) gain step for dynamic range enhancement, (3) punctured transmitter output for longer talk time, (4) frequency band selection for dual-band phones (PCS and cellular), (5) multiple access toggling between systems (CDMA, AMPS, GSM, etc.), and (6) means for circuit bias control in the presence of jammers.

The operating modes of the cellular telephone can have different performance requirements. In the exemplary embodiment, each operating mode is assigned a unique identifier comprising N mode bits. The mode bits define particular characteristics of the operating mode. For example, one mode bit can be used to select between the PCS and cellular band and another mode bit can be used to select between digital (CDMA) or analog (FM) mode. The N mode bits are provided to a logic circuitry within controller 1370 which decodes the N mode bits into a control bus comprising up to $2^N$ control bits. The control bus is routed to circuits within receiver 1300 which require control. For example, the control bus can direct the following: (1) set the IIP3 of the mixer within RF/IF processor 1348 and the LNAs within RF processors 1310*a* and 1310*b*, (2) set the gain of receiver 1300, (3) set the DC bias voltages and/or current to other RF and IF circuitry within receiver 1300, (4) select the desired signal band, and (5) set the oscillators to the proper frequencies.

An exemplary implementation of the IIP3 control for receiver 1300 based on operating mode is illustrated in Tables 1 and 2. Receiver 1300 supports dual-band (PCS and cellular) and dual-mode (CDMA and FM). In the exemplary embodiment, the PCS band only supports CDMA transmission whereas the cellular band supports both CDMA and FM transmissions (the FM transmission can be from the AMPS system). In the exemplary embodiment, four mode bits are utilized. The four mode bits are the BAND_SELECT, IDLE/, FM/, and LNA_RANGE bits. The BAND_SELECT bit determines the band of operation and is defined as 1=PCS and 0=cellular. The IDLE/ bit (0=idle) sets receiver 1300 into idle mode (e.g. operating at lower IIP3) while the cellular telephone is inactive. The FM/ bit (0=FM)

sets receiver 1300 to process FM signal. And the LNA_ RANGE bit (1=bypass) sets the gain of receiver 1300. When the LNA_RANGE bit is set high, designating the bypass mode, Vbias1 and Vbias2 of the first LNA 1320a or 1321a are set low, and the LNA is turned OFF.

When BAND_SELECT is set to 0 (cellular band), receiver 1300 operates in one of the cellular operating modes listed in Table 1. Table 1 only lists the IIP3 operating point of LNAs 1320a and 1320b. A similar table can be generated for the IIP3 operating point of the active mixer within RF/IF processor 1348. While in the cellular mode, the DC bias current for LNAs 1321a and 1321b are turned OFF to conserve battery power.

connected to the output of LNA 1220a and 1220b and mixer 1230 to measure the power of the RF signal from these components. The power measurements are then provided to bias control circuit 1280 which use the information to adjust the IIP3 operating point of any component operating past a predetermined level of non-linearity. In the second embodiment of this receiver setting scheme, power detectors can be connected to the output of mixer 1230 and demodulator 1250 to measure the power of the RF signal and baseband signal, respectively, from these components. The power measurements are also provided to bias control circuit 1280. The difference in power between these two measurements represents the power from the out-of-band signals, which

TABLE 1

Receiver Control for Cellular Operating Modes

| IDLE/ | FM/ | LNA_ RANGE | LNA 1320a Vbias1 | LNA 1320a Vbias2 | LNA 1320b Vbias1 | LNA 1320b Vbias2 | Operating Mode |
|---|---|---|---|---|---|---|---|
| 0 | 0 | 0 | 0 | 1 | 1 | 0 | FM Rx |
| 0 | 0 | 1 | 0 | 0 | 1 | 0 | FM Rx |
| 0 | 1 | 0 | 1 | 0 | 1 | 1 | CDMA Slotted |
| 0 | 1 | 1 | 0 | 0 | 1 | 1 | CDMA Slotted |
| 1 | 0 | 0 | 0 | 1 | 1 | 0 | FM Rx/Tx |
| 1 | 0 | 1 | 0 | 0 | 1 | 0 | FM Rx/Tx |
| 1 | 1 | 0 | 1 | 1 | 1 | 1 | CDMA Rx/Tx |
| 1 | 1 | 1 | 0 | 0 | 1 | 1 | CDMA Rx/Tx |

When BAND_SELECT is set to 1 (PCS band), the telephone operates in one of the PCS operating modes listed in Table 2. While in the PCS mode, the bias current of LNAs 1320a and 1320b are turned OFF to conserve battery power.

can be used to infer the required IIP3 performance. Bias control circuit 1280 adjusts the operating point of the components in the manner described above to maintain the required level of performance. The power detector can be

TABLE 2

Receiver Control for PCS Operating Modes

| IDLE/ | FM/ | LNA_ RANGE | LNA 1321a Vbias1 | LNA 1321a Vbias2 | LNA 1321b Vbias1 | LNA 1321b Vbias2 | Operating Mode |
|---|---|---|---|---|---|---|---|
| 0 | 0 | 0 | x | x | x | x | not used |
| 0 | 0 | 1 | x | x | x | x | not used |
| 0 | 1 | 0 | 1 | 0 | 1 | 1 | PCS Slotted |
| 0 | 1 | 1 | 0 | 0 | 1 | 1 | PCS Slotted |
| 1 | 0 | 0 | x | x | x | x | not used |
| 1 | 0 | 1 | x | x | x | x | not used |
| 1 | 1 | 0 | 1 | 1 | 1 | 1 | PCS Rx/Tx |
| 1 | 1 | 1 | 0 | 0 | 1 | 1 | PCS Rx/Tx |

Tables 1 and 2 list the IIP3 operating points of the LNAs to minimize power consumption while maintaining the require performance. Additional tables can be generated for other circuits which require control. For example, a table can be generated which sets the AGC to the proper operating range based on the expected input signal level for the desired operating mode. Other tables can be generated to set the DC bias voltages or current which are required by various circuits within receiver 1300.

VII. Receiver Setting According to Received Signal Level

In the third embodiment of the present invention, the IIP3 of the active devices are set in accordance with the measured amplitude of the signal at various signal processing stages within the receiver. Referring to FIG. 2, power detectors can be connected to the output of selected components to measure the power level of the signal. In the first embodiment of this receiver setting scheme, power detectors can be implemented in many manner known in the art, such was a diode detector follow by a lowpass filter.

VIII. Current Sources for LNA and Amplifiers

Referring to FIG. 5B and the description of current source 1580 above, Table 3 is generated which lists the control voltages and the resultant circuit configuration. Table 3 is for n-channel MOSFETs 1582 and 1584. Current source 1580 can be labeled as having a parallel topology because MOSFETs 1582 and 1584 are connected in parallel.

TABLE 3

Receiver Control for Cellular Operating Modes

| Vbias1 | Vbias2 | Q2 | Q3 | Circuit Configuration |
|---|---|---|---|---|
| high | X | ON | X | short, maximum current |
| low | low | OFF | OFF | bypass, minimum current |
| low | high | OFF | ON | R4, nominal current |

Figure 11B:
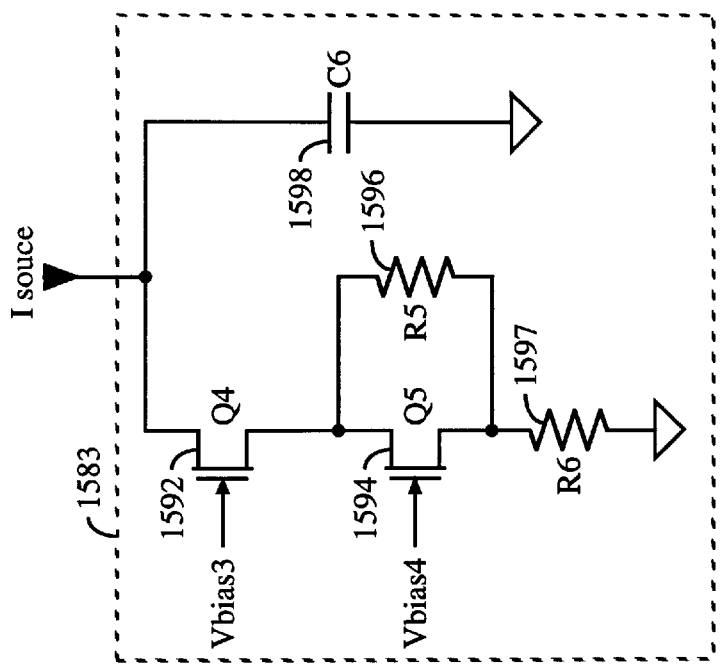
FIGS. 11A–11B are diagrams of as alternative current source in an embodiment of the invention.
Figure 11A:
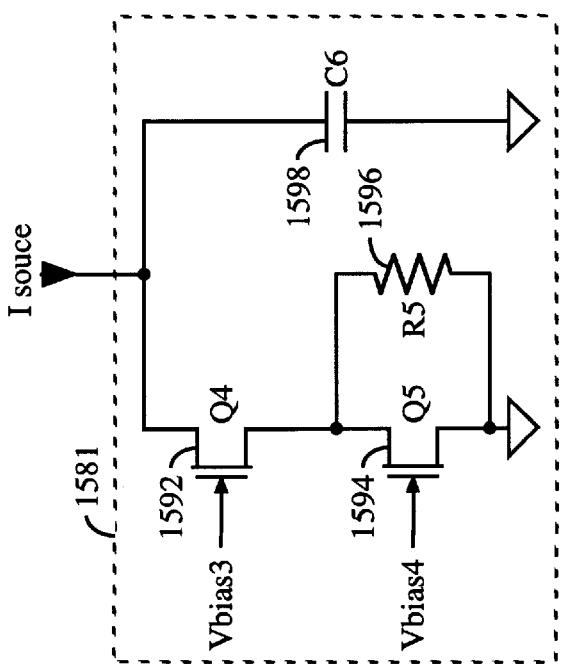

A schematic diagram of an alternative current source 1581 is shown in FIG. 11. The source of n-channel MOSFET 1594 is connected to analog ground. The source of n-channel MOSFET 1592 is connected to the drain of MOSFET 1594. Resistor 1596 is connected across the drain and source of MOSFET 1594. The drain of MOSFET 1592 comprises the output of current source 1581. Bypass capacitor 1598 connects across the output of current source 1580 and analog ground. The gate of MOSFET 1592 is connected to Vbias3 and the gate of MOSFET 1594 is connected to Vbias4.

When MOSFETs 1592 and 1594 are ON, the maximum collector bias current Icc is provided for transistor 1540 of LNA 1220. When MOSFET 1592 is OFF, the minimum collector bias current Icc is provided for transistor 1540 regardless of the state of MOSFET 1594. The minimum collector bias current state is also referred to as the bypass state and can approach no current, depending on the leakage current of the MOSFET device used. Finally, when MOSFET 1592 is ON but MOSFET 1594 is OFF, the collector bias current Icc for transistor 1540 is determined by the resistance of resistor 1596 and the base voltage of transistor 1540. A truct Table 4 is generated for current source 1581 which lists the control voltages and the resultant circuit configuration. Table 4 is also for n-channel MOSFETs 1592 and 1594. Current source 1581 can be labeled as having a series topology because MOSFETs 1592 and 1594 are connected in series.

TABLE 4

Receiver Control for Cellular Operating Modes

| Vbias3 | Vbias4 | Q4 | Q5 | Circuit Configuration |
|---|---|---|---|---|
| high | high | ON | ON | short, maximum current |
| high | low | ON | OFF | R5, nominal current |
| low | X | OFF | X | bypass, minimal current |

Current source 1581 utilizes a different circuit topology from that of current source 1580 to achieve essentially the same result. However, because MOSFET 1592 is connected in series with MOSFET 1594, additional voltage is required across the drain of MOSFET 1592 and the source of MOSFET 1594.

It can be observed from Table 4 that if LNA 1220 is used in one of only two modes (e.g., maximum current or minimum current), then MOSFET 1594 (Q5) can be eliminated and only one control voltage, namely Vbias3, is required. This further simplifies the design of current source 1581. In an alternative embodiment, MOSFET 1592 (Q4) can be eliminated. The remaining MOSFET 1594 and resistor 1596 can provide the maximum or nominal current, depending on whether MOSFET 1594 is turned ON or OFF, respectively.

The benefits provided by current sources 1580 and 1581 are minimum circuit components and ease of interface to the control circuitry. It can be noted from FIGS. 5B and 11 that only two MOSFETs, one resistor, and one capacitor are required for each of the two circuit topologies. Furthermore, the MOSFETs can be selected having threshold voltages which are compatible with that of the control voltages. For example, the threshold voltages of the MOSFETs can be selected such that the MOSFETs will fully turn ON and OFF for transistor-transistor-logic (TTL), emitter-coupled-logic (ECL), or complementary-metal-oxide-semiconductor (CMOS) compatible voltages. In the exemplary embodiment, the gates of the MOSFET are designed to accept digital control voltages.

Tables 3 and 4 shown that each of the current sources has three discrete current output levels (maximum, minimum, and nominal). However, the current sources can be designed having continuous or smaller current steps. Thus, instead of applying only high and low voltages to the gates of the MOSFET, intermediate voltages can also be applied. For a given MOSFET, the drain current is a function of the gate-to-source voltage. Thus, the current of the current source can be adjusted in smaller steps by proper adjustment of the appropriate gate-to-source voltages.

Typically, the drain current versus the gate-to-source voltage for a given MOSFET design varies greatly from one MOSFET to another MOSFET. This variation renders the use of MOSFETs in most applications impractical, except for simple applications such as ON and OFF switching. However, MOSFETs can be used to control current in a continuous (or a substantially continuous) manner by applying calibration and/or control mechanism. As an example, the current of the current source can be measured for various gate-to-source voltages and this characterization can be stored for use later. The characterization can be performed during the production stage in the factory or during normal operation in the field. Alternatively, the current of the current source can be adjusted in a small increment during normal operation, and the non-linearity of the LNA output can be measured and used to adjust the current source. If the level of non-linearity at the output of the LNA is above a predetermined threshold, the current source can be adjusted to provide more current. Alternatively, if the level of non-linearity at the output of the LNA is below the predetermined threshold, the current source can be adjusted to provide less current. Various other methods to calibrate and/or control the current sources otherwise to allow for use in a continuous or a semi-continuous manner (e.g., having more current steps) can be contemplated and are within the scope of the present invention.

Tables 3 and 4 are shown for n-channel enhancement mode MOSFETs. Different tables can be designed to produce the same set of current outputs (maximum, minimum, and nominal) for different input logic using n-channel depletion mode MOSFETs, p-channel enhancement mode MOSFETs, p-channel depletion mode MOSFETs, or a combination of any of the above MOSFET types. In the exemplary embodiment, FETs are utilized for the current sources because FETs consume no additional standby or bias current and are especially suitable for use in a mobile communication device. The same current flows through both the FETs and the LNA. There is no additional gate current through the FETs. However, other transistors (such as J-FET, CMOS, BJT) can also be used and are within the scope of the invention.

The current sources of the present invention can be used for LNA 1220 as described above or other amplifiers.

Numerous amplifier designs are known and used in the art. It is impractical to list a comprehensive list of amplifier designs which can be used for the present invention. However, other amplifier designs can be used and are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A amplifier circuit comprising:

an amplifier for receiving an input signal and providing an output signal;

a variable current source connected to the amplifier for receiving at least one control signal and providing a bias current to the amplifier in response to the at least one control signal; the variable current source comprising:

a first active device for receiving a first control signal and providing the bias current in response to the first control signal a second active device connected in series with the first active device, the second active device receiving a second control signal;

wherein the bias current is provided in response to the first and second control signal a resistor is connected in series with the first active device; and further wherein the bias current is adjusted based on a required performance of the amplifier.

2. The circuit of claim 1 wherein the required performance is based on a linearity of the amplifier.

3. The circuit of claim 1 wherein the required performance is based on a noise performance of the amplifier.

4. The circuit of claim 1 wherein the variable current source is a series topology.

5. The circuit of claim 1 wherein the variable current source is a parallel topology.

6. The circuit of claim 1 wherein the variable current source further comprises:

a second active device connected in parallel with the first active device, the second active device receiving a second control signal; and wherein the bias current is provided in response to the first and second control signals.

7. The circuit of claim 6 wherein the variable current source further comprises:

a resistor connect in series with the second active device.

8. The circuit of claim 1 wherein the variable current source further comprises:

a bypass capacitor connected to the output of the variable current source and ground.

* * * * *